United States Patent
Ishii et al.

(10) Patent No.: US 11,244,935 B2
(45) Date of Patent: Feb. 8, 2022

(54) METHOD OF MANUFACTURING LIGHT-EMITTING MODULE

(71) Applicant: NICHIA CORPORATION, Anan (JP)

(72) Inventors: Takashi Ishii, Tokushima (JP); Dai Wakamatsu, Komatsushima (JP); Hiroaki Kageyama, Tokushima (JP)

(73) Assignee: NICHIA CORPORATION, Anan (JP)

(*) Notice: Subject to any disclaimer, the term of this patent is extended or adjusted under 35 U.S.C. 154(b) by 23 days.

(21) Appl. No.: 17/020,838

(22) Filed: Sep. 15, 2020

(65) Prior Publication Data

US 2021/0082885 A1 Mar. 18, 2021

(30) Foreign Application Priority Data

Sep. 18, 2019 (JP) .............................. JP2019-169177

(51) Int. Cl.
*H01L 21/00* (2006.01)
*H01L 25/075* (2006.01)
*H01L 33/00* (2010.01)

(52) U.S. Cl.
CPC ...... *H01L 25/0753* (2013.01); *H01L 33/0095* (2013.01); *H01L 2933/005* (2013.01); *H01L 2933/0058* (2013.01)

(58) Field of Classification Search
CPC ... H01L 25/167; H01L 25/0753; H01L 33/62; H01L 33/52; H01L 2933/0033; H01L 23/49838; H01L 25/50; H01L 27/1214; H01L 33/36; H01L 33/54
See application file for complete search history.

(56) References Cited

U.S. PATENT DOCUMENTS

| 9,318,871 | B2 * | 4/2016 | Sakata | ................ H01S 5/02345 |
| 9,496,680 | B2 * | 11/2016 | Sakata | ................ H01S 5/02469 |
| 2009/0166657 | A1 | 7/2009 | Yamada et al. | |
| 2012/0007112 | A1 | 1/2012 | Yamada et al. | |
| 2012/0302124 | A1 * | 11/2012 | Imazu | .................. H01L 33/486 445/58 |

(Continued)

FOREIGN PATENT DOCUMENTS

| JP | 2009-182307 | 8/2009 |
| JP | 2016-27620 | 2/2016 |

(Continued)

*Primary Examiner* — Ismail A Muse
(74) *Attorney, Agent, or Firm* — Mori & Ward, LLP

(57) ABSTRACT

A method of manufacturing a light-emitting module that includes providing a light-transmissive member joined body that includes a plurality of submounts, a plurality of light-emitting elements each of which is disposed on a respective one of submounts, and a single light-transmissive member disposed on the light-emitting elements. The method further includes disposing the light-transmissive member joined body on a module board such that the submounts face the module board, forming a plurality of element structures by dividing the single light-transmissive member for each light-emitting element into the element structures each of which includes the submount, the light-emitting element, and the light-transmissive member positioned in this order, and forming a first covering member on the module board to cover lateral surfaces of the element structures.

16 Claims, 21 Drawing Sheets

(56) References Cited

U.S. PATENT DOCUMENTS

| | | | |
|---|---|---|---|
| 2013/0240922 A1* | 9/2013 | Yamamoto | H01L 23/53214 |
| | | | 257/89 |
| 2015/0179891 A1 | 6/2015 | Yamada et al. | |
| 2015/0380622 A1 | 12/2015 | Miyoshi et al. | |
| 2016/0190380 A1* | 6/2016 | Luan | G01S 17/04 |
| | | | 257/82 |
| 2017/0062663 A1 | 3/2017 | Hayashi | |
| 2017/0179360 A1 | 6/2017 | Miyoshi et al. | |
| 2018/0040776 A1 | 2/2018 | Yamada et al. | |
| 2018/0145229 A1 | 5/2018 | Hayashi | |
| 2018/0233494 A1* | 8/2018 | Takeya | H01L 33/502 |
| 2018/0372291 A1 | 12/2018 | Wada et al. | |
| 2020/0152839 A1 | 5/2020 | Hayashi | |
| 2021/0005590 A1* | 1/2021 | Ishii | H01L 33/486 |
| 2021/0028156 A1* | 1/2021 | Kang | H01L 25/0753 |
| 2021/0184087 A1* | 6/2021 | Tu | H01L 25/0753 |

FOREIGN PATENT DOCUMENTS

| | | |
|---|---|---|
| JP | 2017-050366 | 3/2017 |
| JP | 2019-009223 | 1/2019 |

* cited by examiner

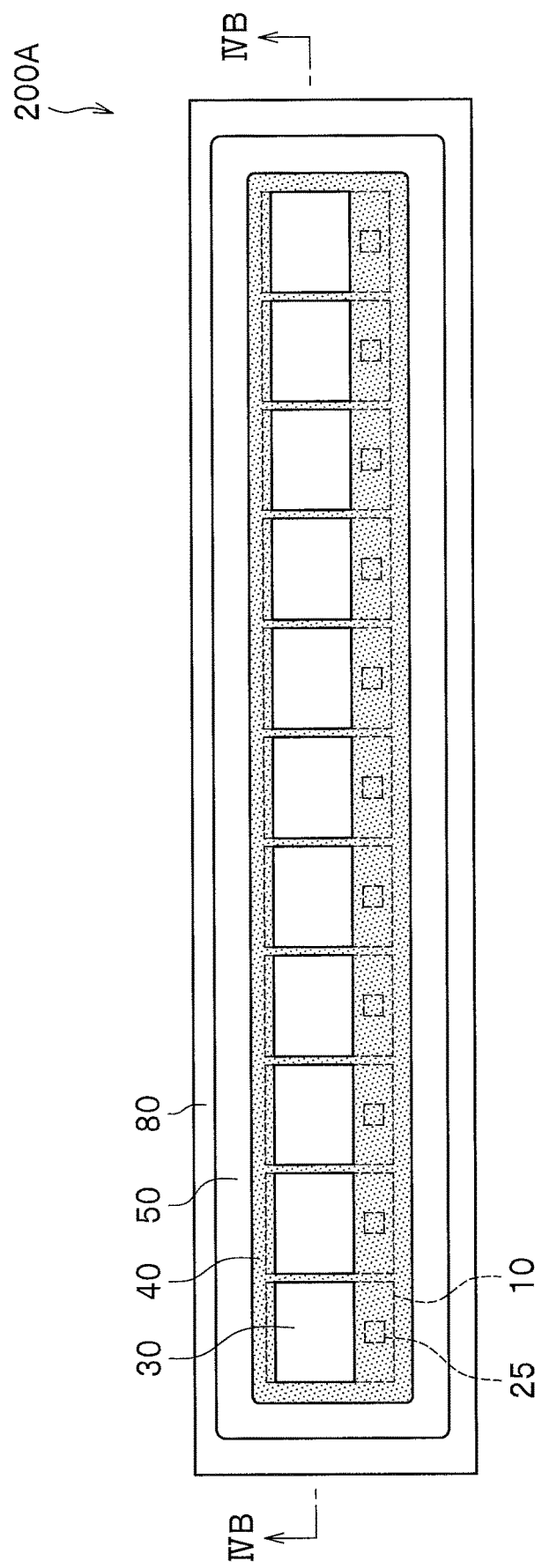

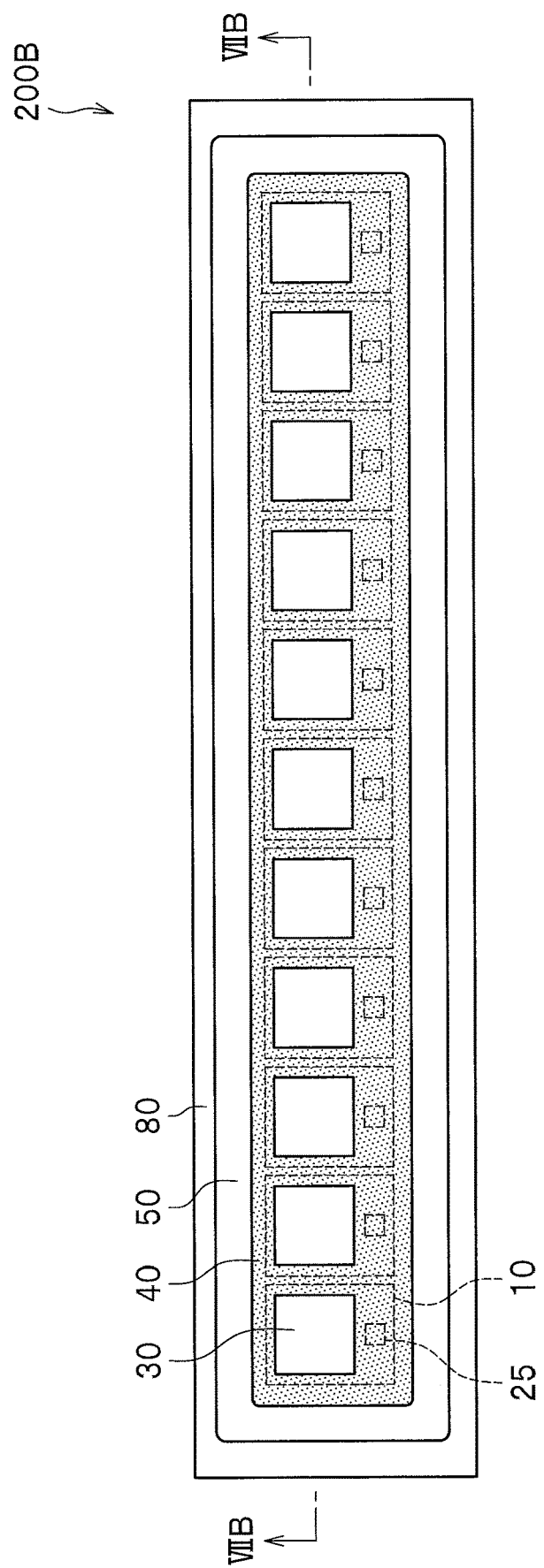

METHOD OF MANUFACTURING LIGHT-EMITTING MODULE

CROSS-REFERENCE TO RELATED APPLICATION

This application claims priority to Japanese Patent Application No. 2019-169177 filed on Sep. 18, 2019, the disclosure of which is hereby incorporated by reference in its entirety.

BACKGROUND

Field of the Invention

The present disclosure relates to a method of manufacturing a light-emitting module.

Discussion of the Background

A light-emitting device including a plurality of light-emitting surfaces is known. For example, Japanese Patent Publication No. 2016-27620 describes a light-emitting device that includes a plurality of light-emitting elements, a light-transmissive member that covers upper surfaces of the light-emitting elements, and a light-reflective member that integrally covers lateral surfaces of the light-emitting elements.

SUMMARY

To densely dispose a plurality of light-emitting surfaces, the structure has room for further improvement. Certain embodiments according to the present disclosure advantageously provide a method of manufacturing a light-emitting module that has small intervals between the light-emitting surfaces.

A method of manufacturing a light-emitting module according to one embodiment of the present disclosure includes: providing a light-transmissive member joined body that includes a plurality of submounts, a plurality of light-emitting elements each of which is disposed on a respective one of submounts, and a single light-transmissive member disposed on the light-emitting elements; disposing the light-transmissive member joined body on a module board such that the submounts face the module board; forming a plurality of element structures by dividing the single light-transmissive member for each light-emitting element into the element structures each of which includes the submount, the light-emitting element, and the light-transmissive member positioned in this order; and forming a first covering member on the module board to cover lateral surfaces of the element structures.

A method of manufacturing a light-emitting module according to another embodiment of the present disclosure includes: providing a light-transmissive member joined body that includes a plurality of submounts, a plurality of light-emitting elements each of which is disposed on a respective one of submounts, and a single light-transmissive member disposed on the light-emitting elements; disposing the light-transmissive member joined body on a module board such that the submounts face the module board; forming a plurality of element structures by dividing the single light-transmissive member for each light-emitting element into the element structures each of which includes the submount, the light-emitting element, and the light-transmissive member positioned in this order; forming a second covering member on the module board to cover lateral surfaces of the submounts; and forming a first covering member on the second covering member to cover lateral surfaces of the light-emitting elements and lateral surfaces of the light-transmissive members, the first covering member having a light reflectance higher than a light reflectance of the second covering member with respect to light emitted from the light-emitting elements.

A method of manufacturing a light-emitting module according to still another embodiment of the present disclosure includes: providing a module board joined body including a module board and an undivided board joined body that includes an undivided board including a plurality of submount regions each of which constitutes a submount after the undivided board is divided, a plurality of light-emitting elements each of which is disposed in a respective one of the submount regions, and a plurality of light-transmissive members each of which is disposed on a respective one of the light-emitting elements, the undivided board joined body being disposed such that the undivided board faces the module board; forming a plurality of element structures by dividing the undivided board for each submount region into the element structures each of which includes the submount, the light-emitting element, and the light-transmissive member positioned in this order; and forming a first covering member on the module board to cover lateral surfaces of the element structures.

A method of manufacturing a light-emitting module according to still another embodiment of the present disclosure includes: providing a module board joined body including a module board and an undivided board joined body that includes an undivided board including a plurality of submount regions each of which constitutes a submount after the undivided board is divided, a plurality of light-emitting elements each of which is disposed in a respective one of the submount regions, and a plurality of light-transmissive members each of which is disposed on a respective one of the light-emitting elements, the undivided board joined body being disposed such that the undivided board faces the module board; forming a plurality of element structures by dividing the undivided board for each of the submount regions into the element structures each of which includes the submount, the light-emitting element, and the light-transmissive member positioned in this order; forming a second covering member on the module board to cover lateral surfaces of the submounts; and forming a first covering member on the second covering member to cover lateral surfaces of the light-emitting elements and lateral surfaces of the light-transmissive members, the first covering member having a light reflectance higher than a light reflectance of the second covering member with respect to light emitted from the light-emitting elements.

A light-emitting module that has small intervals between light-emitting surfaces can be manufactured by a method of manufacturing a light-emitting module according to certain embodiments of the present disclosure.

BRIEF DESCRIPTION OF THE DRAWINGS

FIG. 4A is a top view schematically illustrating the structure of a light-emitting module according to a second embodiment.

FIG. 7A is a top view schematically illustrating the structure of a light-emitting module according to a third embodiment.

DETAILED DESCRIPTION OF EMBODIMENTS

Figure 1A:
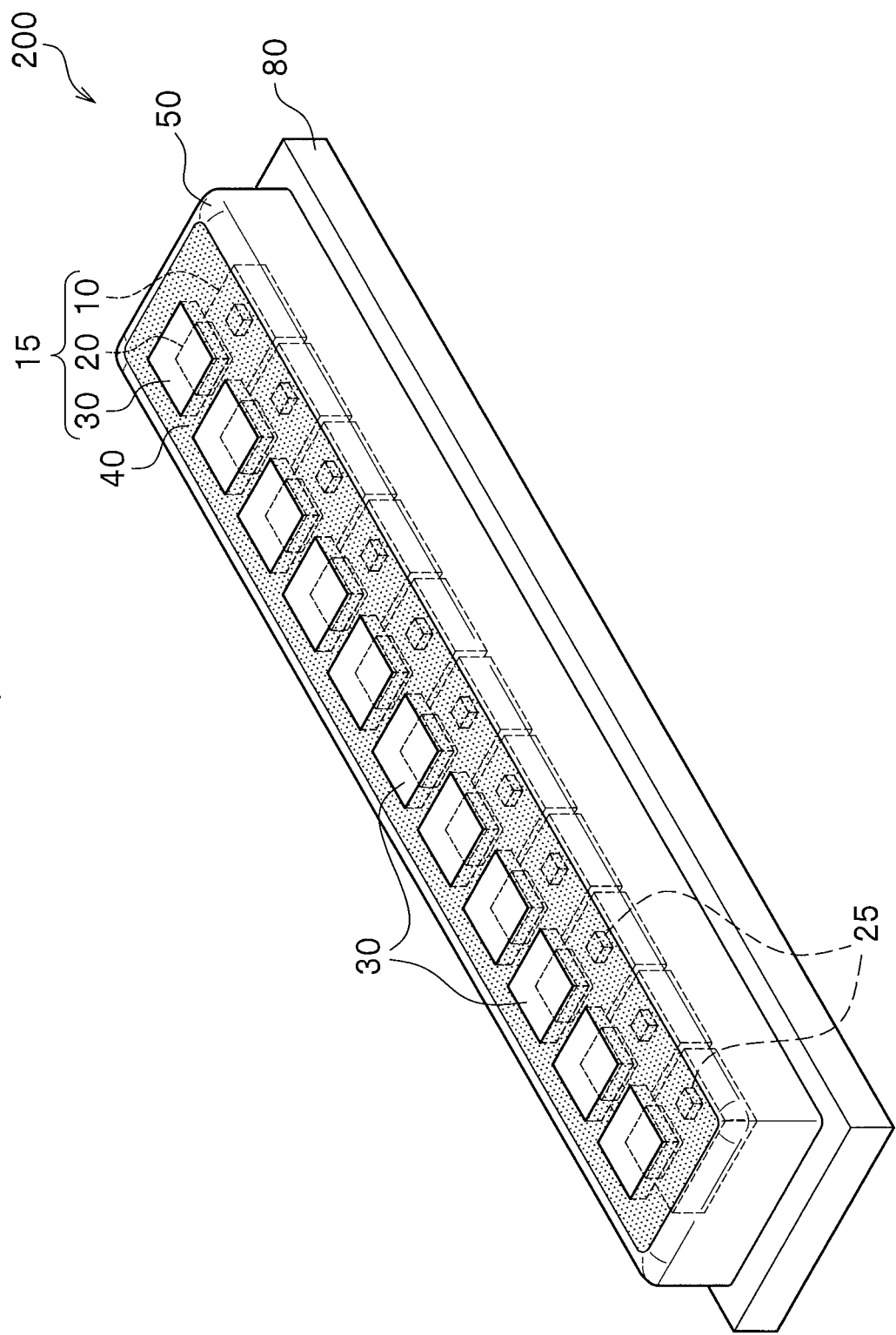
FIG. 1A is a perspective view schematically illustrating a structure of a light-emitting module according to a first embodiment.

Certain embodiments of the present disclosure are described below with reference to the drawings. The embodiments described below are examples of a light-emitting module and a method of manufacturing a light-emitting module according to the technical ideas of certain embodiments, but the present invention is not limited to the embodiments described below. Unless specifically stated otherwise, the sizes, materials, shapes, and relative positions of constituent components described referring to the embodiments are not intended to limit the scope of the present invention, but are rather merely examples. Magnitudes or positional relationships of members illustrated in the drawings may be exaggerated in order to clarify the descriptions. The number of the light-emitting elements illustrated in each drawing is an example to facilitate understanding of the structure.

First Embodiment

Light-Emitting Module

Figure 1B:
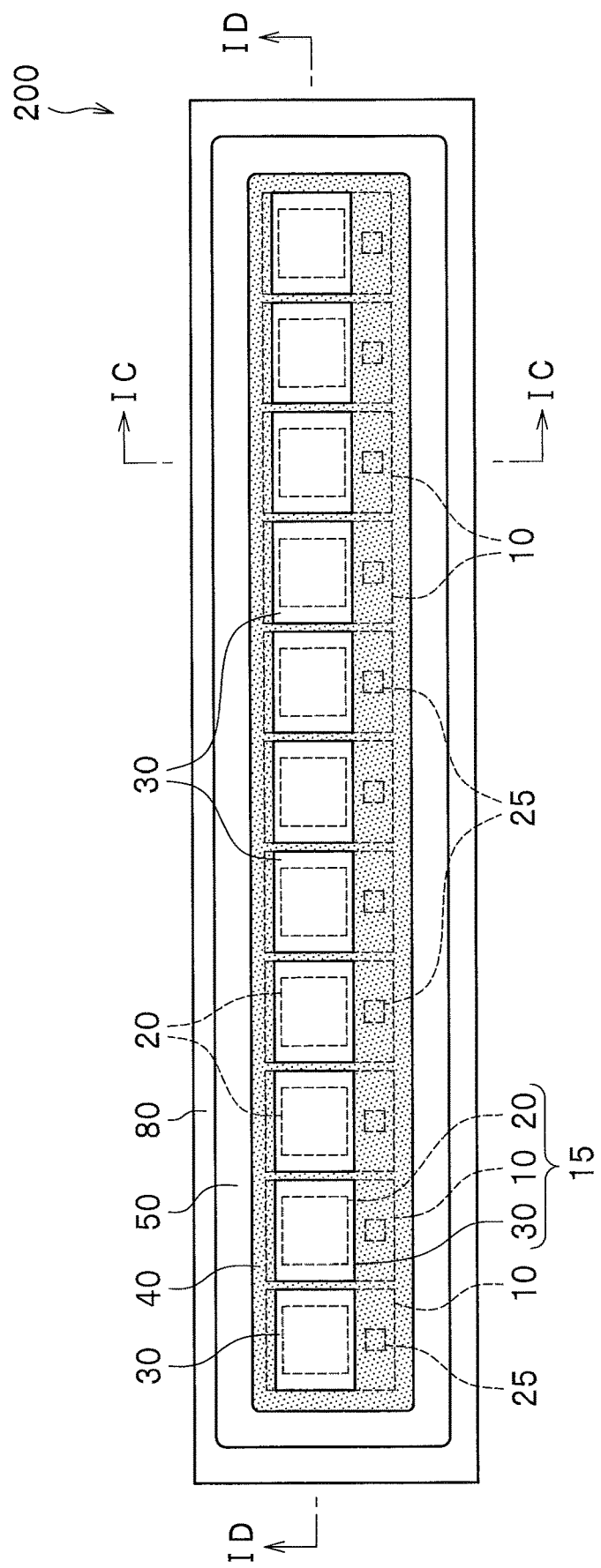
FIG. 1B is a top view schematically illustrating the structure of the light-emitting module according to the first embodiment.
Figure 1C:
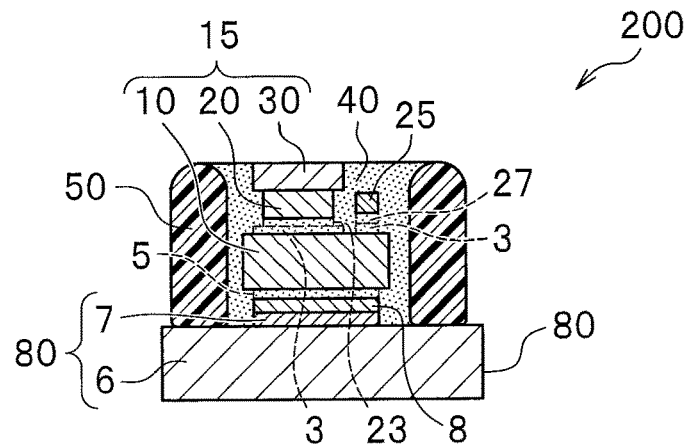
FIG. 1C is a schematic cross-sectional view taken along a line IC-IC of FIG. 1B.
Figure 1D:
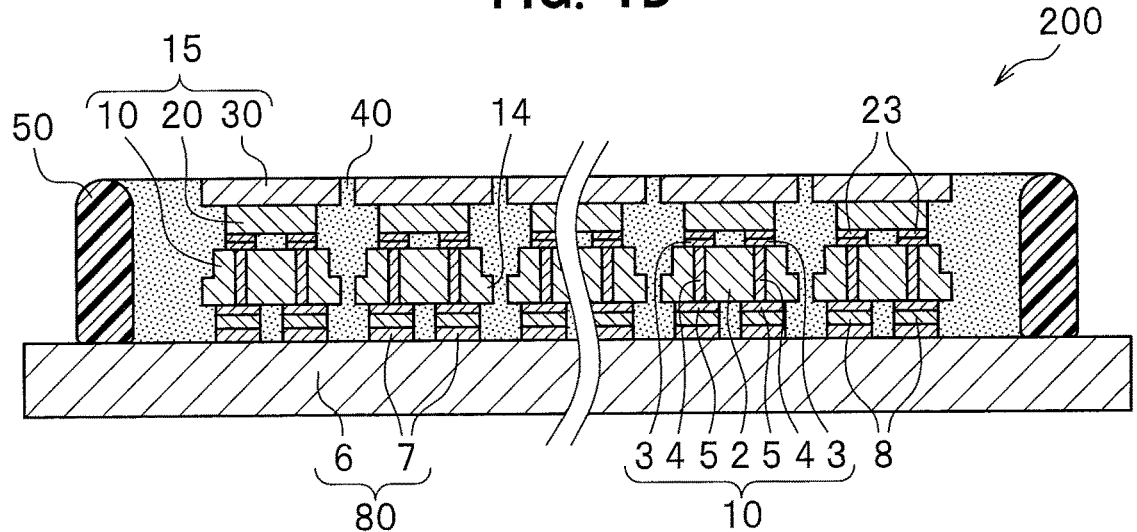
FIG. 1D is a schematic cross-sectional view taken along a line ID-ID of FIG. 1B.
Figure 1E:
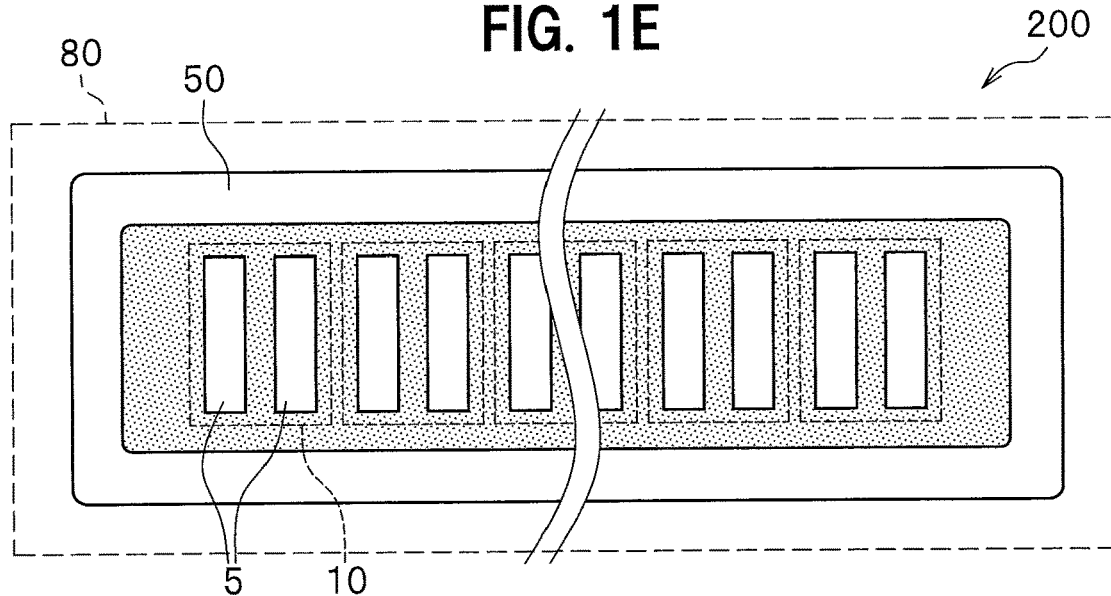
FIG. 1E is a bottom view schematically illustrating a bottom surface of an element structure seen through part in the light-emitting module according to the first embodiment.

FIG. 1A is a perspective view schematically illustrating a structure of a light-emitting module according to a first embodiment. FIG. 1B is a top view schematically illustrating the structure of the light-emitting module according to the first embodiment. FIG. 1C is a schematic cross-sectional view taken along a line IC-IC of FIG. 1B. FIG. 1D is a schematic cross-sectional view taken along a line ID-ID of FIG. 1B. FIG. 1E is a bottom view schematically illustrating a bottom surface of an element structure seen through part in the light-emitting module according to the first embodiment.

A light-emitting module 200 includes: a plurality of element structures 15 each of which includes a submount 10, a light-emitting element 20, and a light-transmissive member 30 positioned in this order; a first covering member 40 that covers lateral surfaces of each element structure 15 to hold the element structures 15; and a module board 80. The element structures 15 are mounted on the module board 80 such that each submount 10 faces the module board 80.

The light-emitting module 200 mainly includes the submounts 10, the light-emitting elements 20, protective elements 25, the light-transmissive members 30, the first covering member 40, a frame 50, and the module board 80. Configurations of the light-emitting module 200 will be described below.

The light-emitting element 20 and the protective element 25 are mounted on the submount 10. The light-emitting element 20 and the protective element 25 are disposed on the module board 80 via the submount 10. The submount 10 has, for example, a substantially rectangular shape in a top view. The submount 10 includes a base portion 2 and wirings to electrically connect the light-emitting element 20 and the protective element 25 to external components. Specifically, the submount 10 includes the base portion 2 and the wirings that are disposed in the base portion 2 and include first wiring portion(s) 3, inner wiring portion(s) 4, and second wiring portion(s) 5.

A preferable material for the base portion 2 includes an insulating material that is unlikely to transmit light such as light emitted from the light-emitting element 20 and external light. Examples of the materials include ceramics such as alumina, aluminum nitride, and mullite, thermoplastic resins such as polyamides (PA), polyphthalamide (PPA), polyphenylene sulfide (PPS), and liquid crystal polymers, and other resins such as epoxy resins, silicone resins, modified epoxy resins, urethane resins, and phenolic resins. Among these materials, ceramics having high heat dissipation performance are preferably used.

In a method of manufacturing the light-emitting module 200 described below, grooves 13 are formed on a surface on which the light-emitting elements 20 are mounted (see FIG. 3A) in an undivided board 11, so that each of the base portion 2 includes at least an extending portion 14. On a lateral surface in a longitudinal direction of the light-emitting module 200, the extending portion 14 extends outwardly from a portion of the lateral surface close to the module board 80.

In the light-emitting module 200, the distance between the submounts 10 that are adjacent to each other is preferably 0.05 mm or more and 0.2 mm or less. Then, the first covering member 40 disposed between the submounts 10 has a thickness of 0.05 mm or more and 0.2 mm or less. Accordingly, the adjacent submounts 10 can be bonded with each other. Also, influence of thermal stress can be reduced. The distance between the adjacent submounts 10 can be referred to as the distance between the extending portions 14 of the base portions 2.

The first wiring portions 3 are disposed on an upper surface of the base portion 2, and are electrically connected to the light-emitting element 20 and the protective element 25. The second wiring portions 5 are disposed on a lower surface of the base portion 2, and electrically connected to an external power supply, serving as an external electrode for the light-emitting element 20 and the protective element 25. The inner wiring portions 4 penetrate the base portion 2, and electrically connect the first wiring portions 3 and the second wiring portions 5. The light-emitting module may not include the protective elements 25.

For example, a metal such as Fe, Cu, Ni, Al, Ag, Au, Pt, Ti, W, and Pd, or an alloy containing at least one of these metals can be used for each of the first wiring portions 3, the inner wiring portions 4, and the second wiring portions 5. The first wiring portion 3, the inner wiring portion 4, and the second wiring portion 5 can be formed by, for example, electroplating, electroless plating, vapor deposition, and sputtering.

The light-emitting element 20 is a semiconductor element itself emits light when voltage is applied. An appropriate shape, size, and the like of the light-emitting element 20 can be selected. The emission color of the light-emitting element 20 can be selected from any appropriate wavelength depending on the purpose. Examples of a light-emitting element 20 emitting blue light with wavelengths of 430 nm to 500 nm or green light with wavelengths of 500 nm to 570 nm include a light-emitting element including a nitride semiconductor ($In_XAl_YGa_{1-X-Y}N$, where $0 \leq X$, $0 \leq Y$, and $X+Y \leq 1$), GaP, and the like. For a red light-emitting element 20 emitting light with wavelengths of 610 nm to 700 nm, GaAlAs, AlInGaP, and the like can be used besides a nitride semiconductor element.

The light-emitting element 20 preferably includes positive and negative element electrodes 23 on one surface. This structure enables the light-emitting element 20 to be flip-chip mounted on the first wiring portions 3 of the submount 10 using electroconductive adhesives. Examples of the electroconductive adhesive materials include eutectic solder, electroconductive paste, and bumps.

The protective element 25 is, for example, a Zener diode. The protective element 25 includes positive and negative element electrodes 27 on one surface and is flip-chip mounted on the first wiring portions 3 of the submount 10 using the electroconductive adhesives.

If the protective element 25 is not disposed on the submount 10, it is preferable that protective element 25 be disposed on the module board 80. Electronic components other than the protective element 25 can be disposed on the submount 10 and the module board 80

The light-transmissive member 30 is formed of, for example, resins, glass, or inorganic materials. Each of the light-transmissive members 30 is disposed on a respective one of the light-emitting elements 20. The light-transmissive member 30 preferably has an upper surface that is larger than an upper surface of the light-emitting element 20.

In the light-emitting module 200, the distance between the adjacent light-transmissive members 30 exposed on an upper surface of the light-emitting module 200 is preferably 0.2 mm or less. With the distance between the light-transmissive members 30 being 0.2 mm or less, for example, the light-emitting module 200 can serve as a compact light source for use in an adaptive driving beam (ADB) for vehicles, so that the size of the headlight lens can be decreased. Accordingly, a primary lens in optics can be omitted, and loss of light may be decreased while passing through the headlight lens. The distance between the light-transmissive members 30 is more preferably 0.1 mm or less, further preferably 0.05 mm or less in terms of reduction in the size of the light source. The distance between the light-transmissive members 30 is preferably 0.03 mm or more in terms of facilitation of manufacturing the light-emitting module 200.

The light-transmissive member 30 can have various planer shapes such as a circular shape, an elliptic shape, a square, and a polygonal shape such as a hexagonal shape. Among these shapes, the light-transmissive member 30 preferably has a rectangular shape such as a square or rectangle, more preferably has a similar shape to the planer shape of the light-emitting element 20.

The light-transmissive member 30 can contain a wavelength conversion material. Examples of the wavelength conversion material include phosphors. Examples of the light-transmissive member 30 that contains phosphors include a sintered body of phosphors and a mixture of phosphor powder and other materials such as resins, glass, ceramics, and other inorganic substances. The light-transmissive member 30 can be a compact that is formed of resins, glass, or ceramics, and is provided with a resin layer containing phosphors or a glass layer containing phosphors on a surface of the compact. The light-transmissive member 30 can contain fillers such as diffusing materials depending on the purpose. In the case of containing fillers such as diffusing materials, the light-transmissive member 30 can be formed of resins, glass, ceramics, and other inorganic substances that contains fillers. Alternatively, the light-transmissive member 30 can be a compact that is formed of resins, glass, or ceramics, and be provided with a resin layer containing fillers or a glass layer containing fillers on a surface of the compact.

A substance known in the art can be used for the phosphor. Examples of green-emitting phosphors include yttrium-aluminum-garnet based phosphors (for example, $Y_3(Al,Ga)_5O_{12}:Ce$), lutetium-aluminum-garnet based phosphors (for example, $Lu_3(Al,Ga)_5O_{12}:Ce$), terbium-aluminum-garnet based phosphors (for example, $Tb_3(Al,Ga)_5O_{12}:Ce$), silicate based phosphors (for example, $(Ba, Sr)_2SiO_4:Eu$), chiorosilicate based phosphors (for example, $Ca_8Mg(SiO_4)_4C_{12}:Eu$), β-SiAlON based phosphors (for example, $Si_{6-z}Al_zO_zN_{8-z}:Eu$ ($0<z<4.2$)), SGS based phosphors (for example, $SrGa_2S_4:Eu$). Examples of yellow-emitting phosphors include α-SiAlON phosphors (for example, $Mz(Si,Al)_{12}(O,N)_{16}$ (where $0<z\leq2$, and M is Li, Mg, Ca, Y, or a lanthanoid element except for La and Ce). Some of the above green-emitting phosphors emit yellow light.

Also, for example, yellow light can be obtained by substituting part of Y in an yttrium-aluminum-garnet phosphor with Gd to shift its emission peak wavelength to a longer wavelength. Some of these phosphors can emit orange light. Examples of red-emitting phosphors include nitrogen-containing calcium aluminosilicate (CASN or SCASN) phosphors (for example, $(Sr,Ca)AlSiN_3:Eu$), and BSESN phosphors (for example, $(Ba,Sr,Ca)_2Si_5N_8:Eu$). The examples also include manganese-activated fluoride phosphors (phosphors represented by the general formula (I) $A_2[M_{1-a}Mn_aF_6]$ (in the general formula (I), the symbol "A" is at least one selected from the group consisting of K, Li, Na, Rb, Cs, and $NH_4$, "M" is at least one element selected from the group consisting of the Group IV elements and the Group XIV elements, and the symbol "a" satisfies $0<a<0.2$)). Specific examples of the manganese-activated fluoride phosphors include manganese-activated potassium fluorosilicate phosphors (for example, $K_2SiF_6:Mn$).

A substance known in the art can be used for the diffusing material. For example, barium titanate, titanium oxide, aluminum oxide, or silicon oxide can be used.

If a resin is used for the light-transmissive member 30 or used for a binder for phosphors and diffusing materials, examples of the resin materials include thermosetting resins such as epoxy resins, modified epoxy resins, silicone resins, and modified silicone resins.

The first covering member 40 is disposed on the module board 80 to surround the plurality of element structures 15. A resin material is preferably used for the first covering member 40. The first covering member 40 is, for example, formed of a light-reflective resin containing the reflective material and, covers lateral surfaces of the element structures 15 on the module board 80. That is, the first covering member 40 covers lateral surfaces of the submount 10, lateral surfaces of the light-emitting element 20, and lateral surfaces of light-transmissive member 30. The first covering member 40 is disposed between the adjacent element structures 15 to cover outer lateral surfaces of each element structure 15. If the light-emitting module 200 includes the frame 50, the first covering member 40 is disposed between the frame 50 and the element structures 15 inward of the frame 50, as well as between the element structures 15.

Examples of resin materials for the first covering member 40 include the resin materials listed as examples for the light-transmissive member 30. Examples of light-reflective materials contained in the resin for the first covering member 40 include titanium oxide, silica, silicon oxide, aluminum oxide, zirconium oxide, magnesium oxide, potassium titanate, zinc oxide, and boron nitride. Among these materials, titanium oxide, which has a comparatively high refractive index, is preferably used in view of reflection of light.

The frame member 50 surrounds the plurality of element structures 15 and holds the first covering member 40. The frame 50 has, for example, a rectangular shape in a top view. The frame 50 surrounds the element structures 15 on the module board 80. The expression "the rectangular shape" as used herein refers to a rectangular frame shape or a rectangular annular shape.

The frame 50 can be formed of a resin containing a light-reflective material. Examples of resin materials for the frame 50 include the resin materials listed as examples for the light-transmissive member 30. Examples of reflective materials contained in the resin for the frame 50 include the reflective materials listed as examples contained in the resin for the first covering member 40.

A metal, an alloy, or a ceramic can be used for the frame.

The light-emitting module 200 includes the plurality of element structures 15. Eleven element structures 15 are held by the first covering member 40 in a line. However, the number of the element structures 15 in the light-emitting module can be ten or less, or twelve or more.

The module board 80 is a member on which the element structures 15 is mounted. The module board 80 electrically connects the light-emitting elements 20 and the protective elements 25 to external components. The module board 80 has, for example, a substantially rectangular shape in a top view. The module board 80 includes a board portion 6 and third wiring portions 7.

Examples of materials for the board portion 6 include the materials listed as examples for the base portion 2 of the submount 10. Examples of materials for the third wiring portions 7 include the materials listed as examples for the first wiring portions 3 of the submount 10.

The element structure 15 is mounted on an upper surface of the module board 80 such that the second wiring portions 5 and the third wiring portions 7 are bonded via electroconductive adhesives 8. Examples of the electroconductive adhesives 8 include eutectic solder, electroconductive paste, and bumps.

Operation of Light-Emitting Module

When the light-emitting module 200 operates, an electric current is supplied to each of the light-emitting elements 20 from an external power supply via the third wiring portions 7, the second wiring portions 5, the inner wiring portions 4, and the first wiring portions 3, and then, the light-emitting element 20 emits light. A portion of the light emitted from the light-emitting elements 20 travels upward and is extracted to the outside of the upper side of the light-emitting module 200 via the light-transmissive member 30. A portion of the light traveling downward is reflected at the submount 10, and is extracted to the outside of the light-emitting module 200 via the light-transmissive member 30. A portion of the light traveling between the light-emitting elements 20 and the frame 50 is reflected at the first covering member 40 and the frame 50, and is extracted to the outside of the light-emitting module 200 via the light-transmissive member 30. A portion of the light traveling between the light-emitting elements 20 is reflected at the first covering member 40, and is extracted to the outside of the light-emitting module 200 via the light-transmissive member 30. In the case of using the light-emitting module 200 as a light source of a vehicle headlight, a small distance between the light-transmissive members 30 (for example, 0.2 mm or less) allows the optical system to have a simple and compact structure.

Method of Manufacturing Light-Emitting Module

Figure 2:
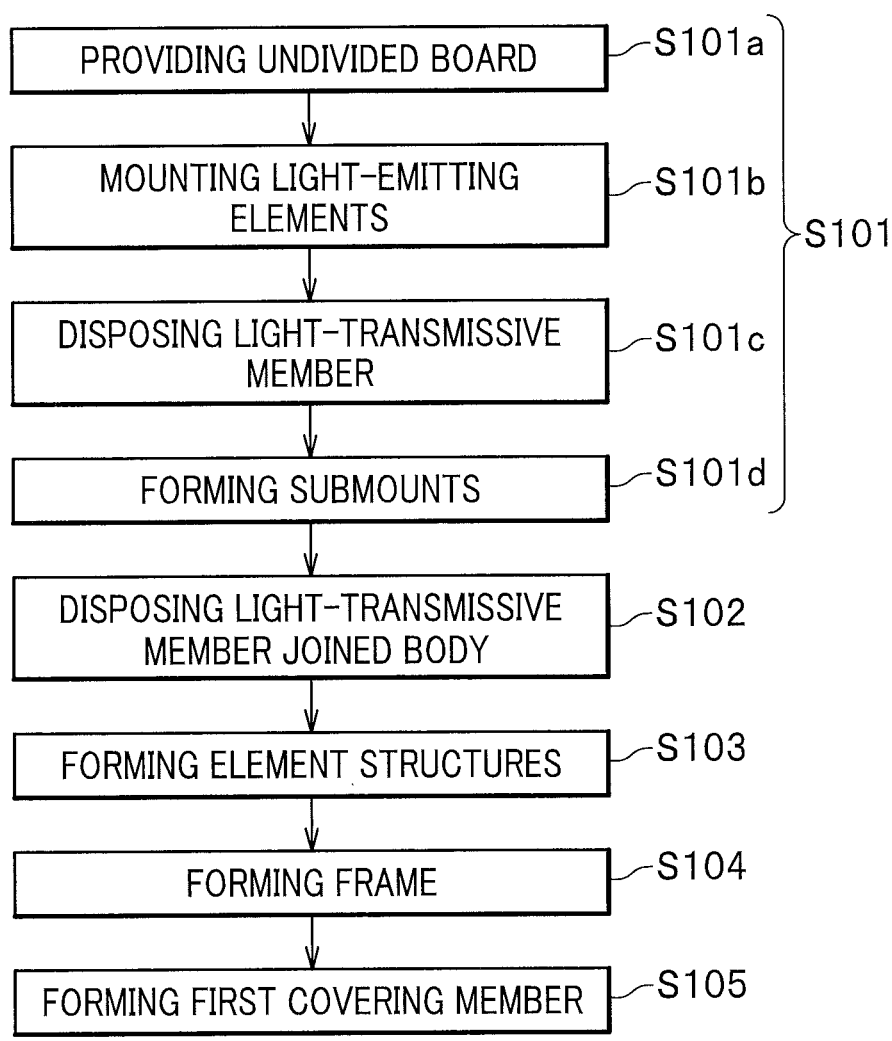
FIG. 2 is a flowchart of a method of manufacturing the light-emitting module according to the first embodiment.
Figure 3A:
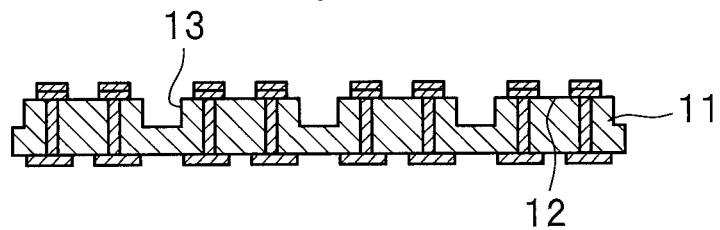
FIG. 3A is a schematic cross-sectional view illustrating a step of providing an undivided board in the method of manufacturing the light-emitting module according to the first embodiment.
Figure 3B:
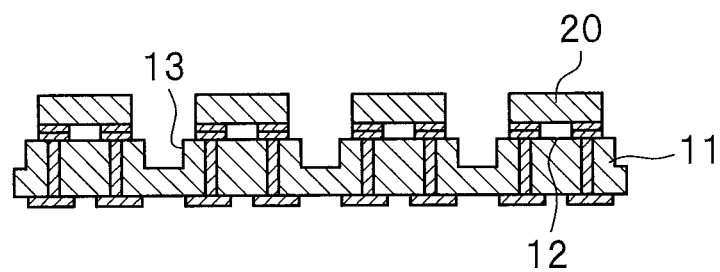
FIG. 3B is a schematic cross-sectional view illustrating a step of mounting light-emitting elements in the method of manufacturing the light-emitting module according to the first embodiment.
Figure 3C:
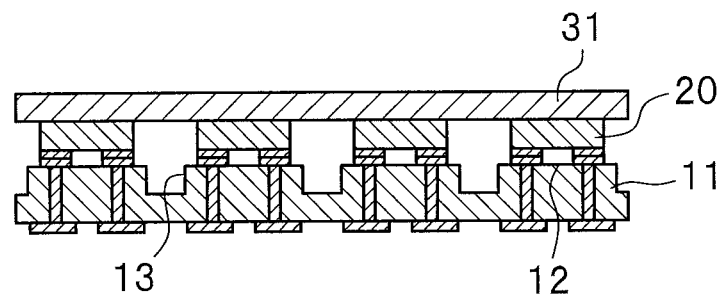
FIG. 3C is a schematic cross-sectional view illustrating a step of disposing a single light-transmissive member in the method of manufacturing the light-emitting module according to the first embodiment.
Figure 3D:
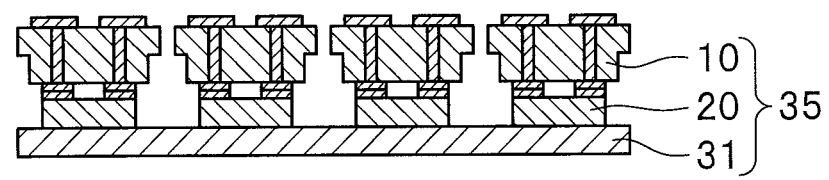
FIG. 3D is a schematic cross-sectional view illustrating a step of forming a submount in the method of manufacturing the light-emitting module according to the first embodiment.
Figure 3E:
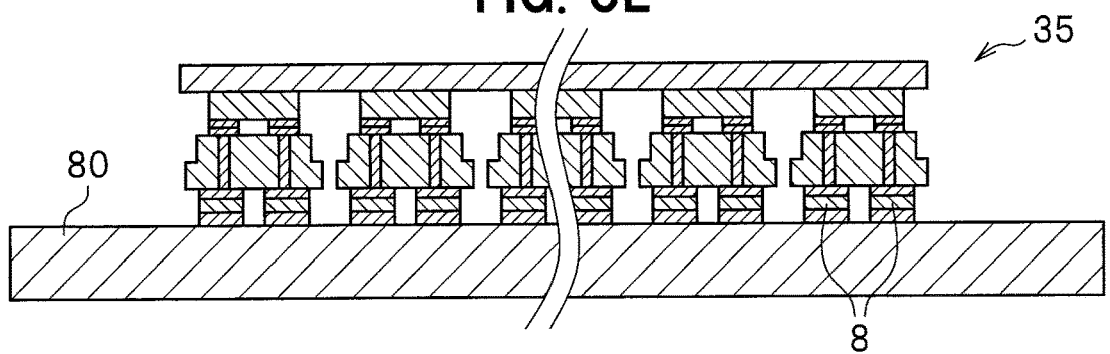
FIG. 3E is a schematic cross-sectional view illustrating a step of mounting a light-transmissive member joined body in the method of manufacturing the light-emitting module according to the first embodiment.
Figure 3F:
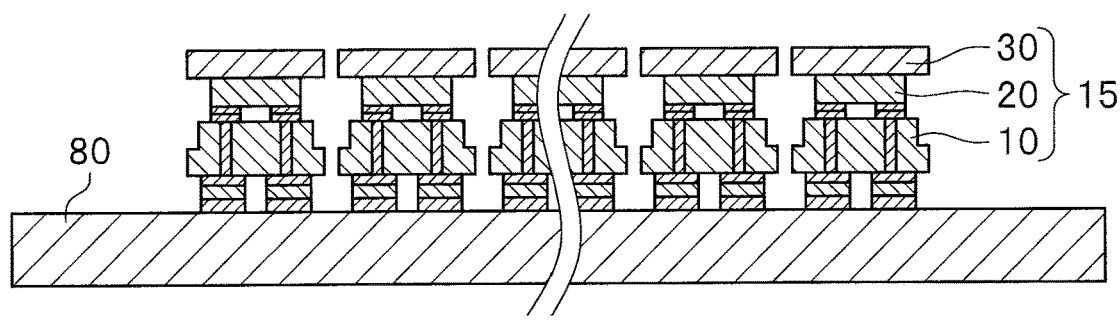
FIG. 3F is a schematic cross-sectional view illustrating a step of forming the element structure in the method of manufacturing the light-emitting module according to the first embodiment.
Figure 3G:
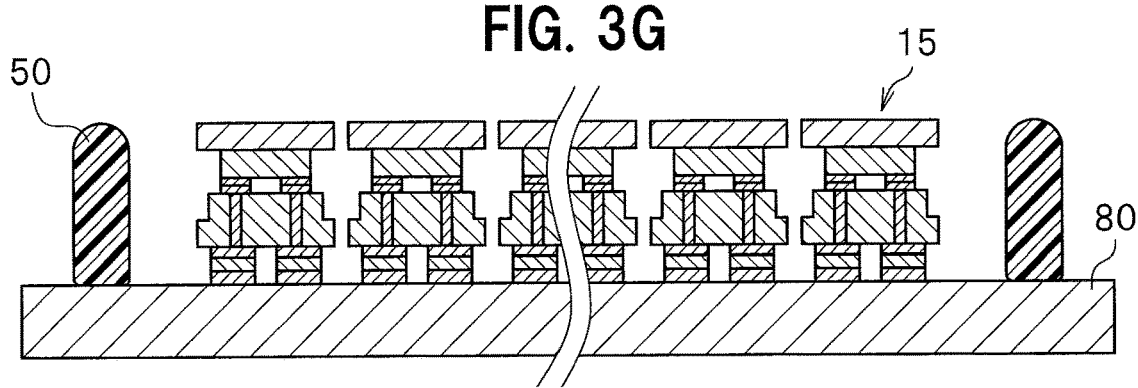
FIG. 3G is a schematic cross-sectional view illustrating a step of forming a frame in the method of manufacturing the light-emitting module according to the first embodiment.
Figure 3H:
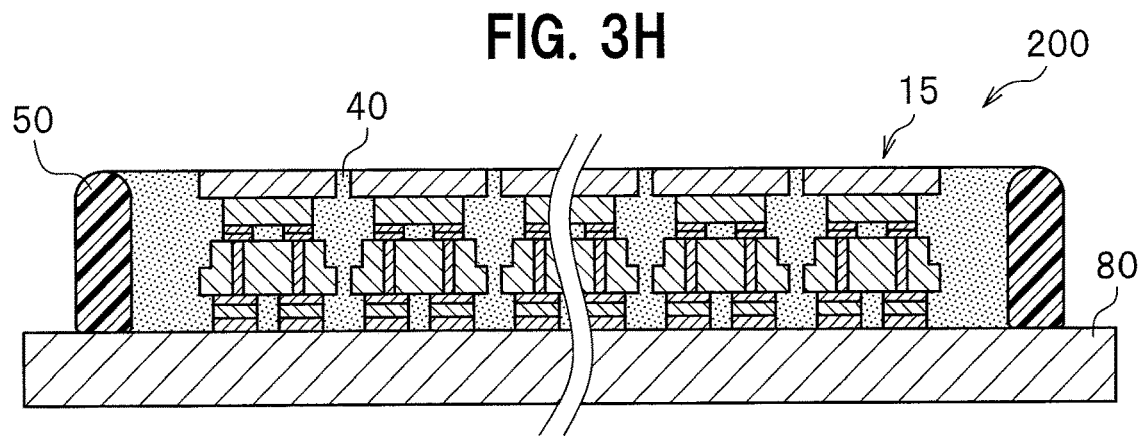
FIG. 3H is a schematic cross-sectional view illustrating a step of forming a first covering member in the method of manufacturing the light-emitting module according to the first embodiment.
Figure 3I:
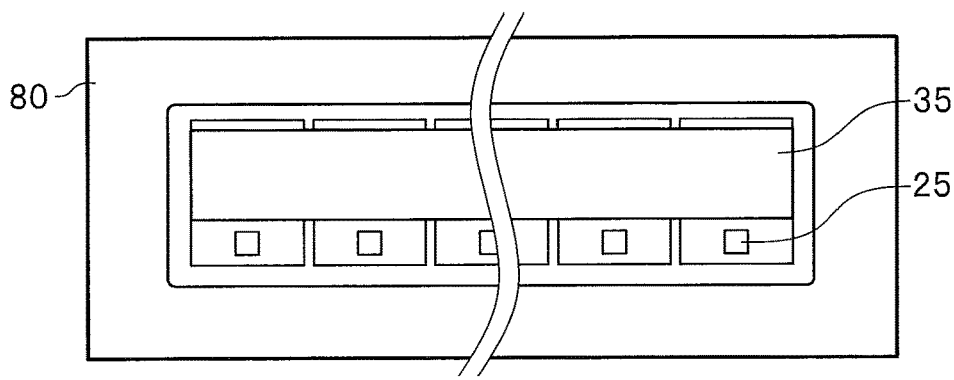
FIG. 3I is a schematic top view illustrating the step of mounting the light-transmissive member joined body in the method of manufacturing the light-emitting module according to the first embodiment.
Figure 3J:
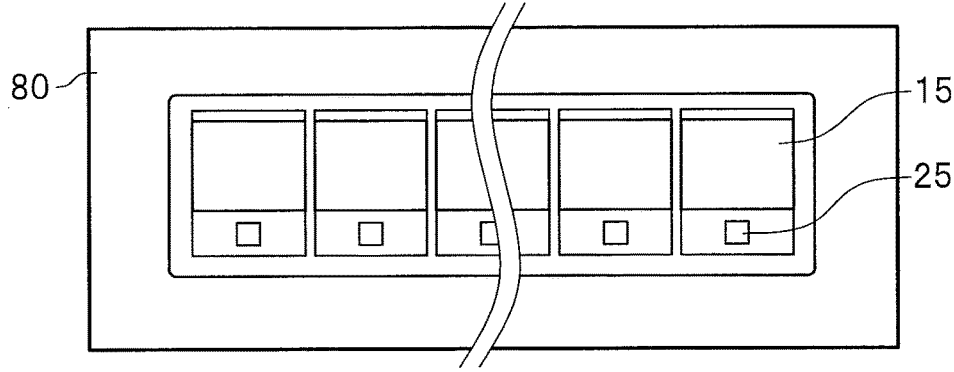
FIG. 3J is a schematic top view illustrating the step of forming the element structure in the method of manufacturing the light-emitting module according to the first embodiment.
Figure 3K:
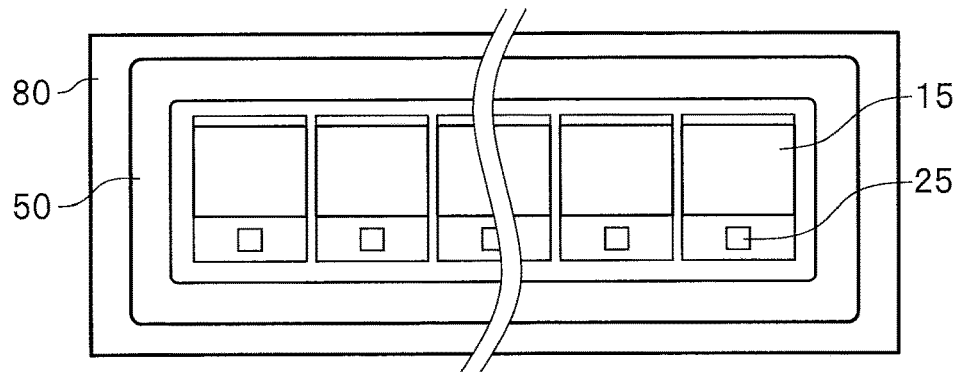
FIG. 3K is a schematic top view illustrating the step of forming the frame in the method of manufacturing the light-emitting module according to the first embodiment.
Figure 3L:
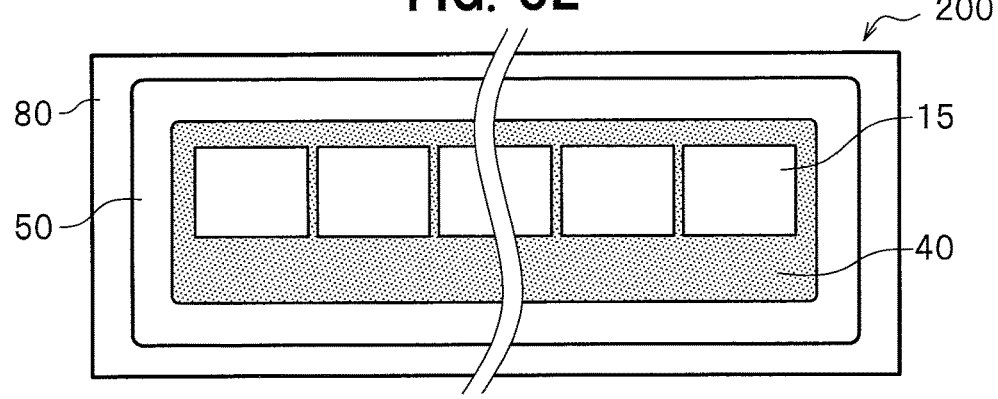
FIG. 3L is a schematic top view illustrating the step of forming the first covering member in the method of manufacturing the light-emitting module according to the first embodiment.

FIG. 2 is a flowchart of a method of manufacturing the light-emitting module according to the first embodiment. FIG. 3A is a schematic cross-sectional view illustrating a step of providing an undivided board in the method of manufacturing the light-emitting module according to the first embodiment. FIG. 3B is a schematic cross-sectional view illustrating a step of mounting light-emitting elements in the method of manufacturing the light-emitting module according to the first embodiment. FIG. 3C is a schematic cross-sectional view illustrating a step of disposing a single light-transmissive member in the method of manufacturing the light-emitting module according to the first embodiment. FIG. 3D is a schematic cross-sectional view illustrating a step of forming a submount in the method of manufacturing the light-emitting module according to the first embodiment. FIG. 3E is a schematic cross-sectional view illustrating a step of disposing a light-transmissive member joined body in the method of manufacturing the light-emitting module according to the first embodiment. FIG. 3F is a schematic cross-sectional view illustrating a step of forming the element structure in the method of manufacturing the light-emitting module according to the first embodiment. FIG. 3G is a schematic cross-sectional view illustrating a step of forming a frame in the method of manufacturing the light-emitting module according to the first embodiment. FIG. 3H is a schematic cross-sectional view illustrating a step of forming a first covering member in the method of manufacturing the light-emitting module according to the first embodiment. FIG. 3I is a schematic top view illustrating the step of disposing the light-transmissive member joined body in the method of manufacturing the light-emitting module according to the first embodiment. FIG. 3J is a schematic top view illustrating the step of forming the element structure in the method of manufacturing the light-emitting module according to the first embodiment. FIG. 3K is a schematic top view illustrating the step of forming the frame in the method of manufacturing the light-emitting module according to the first embodiment. FIG. 3L is a schematic top view illustrating the step of forming the first covering member in the method of manufacturing the light-emitting module according to the first embodiment.

A method of manufacturing the light-emitting module 200 includes: a step S101 of providing a light-transmissive member joined body 35 that includes a plurality of submounts 10, a plurality of light-emitting elements 20 respectively disposed on the submounts 10, and a single light-transmissive member 31 disposed on the light-emitting elements 20; a step S102 of disposing the light-transmissive member joined body 35 on a module board 80 such that the submounts 10 face the module board 80; a step S103 of forming a plurality of element structures by dividing the single light-transmissive member 31 for each light-emitting element 20 into the element structures 15 each of which includes the submount 10, the light-emitting element 20, and the light-transmissive member 30 positioned in this order; a step S104 of forming a frame 50 on the module board 80 to surround the element structures 15; and a step S105 of forming a first covering member 40 on the module board 80 to cover lateral surfaces of each element structure 15.

The step S101 of providing the light-transmissive member joined body includes a step S101a of providing an undivided board 11 including a plurality of submount regions 12 each of which constitutes the submount 10 after the undivided board 11 is divided, a step S101b of mounting the light-emitting elements 20 in the submount regions 12, a step S101c of disposing a single light-transmissive member 31 on the light-emitting elements 20, and a step S101d of forming the submounts by dividing the undivided board 11 for each submount region 12 into the submounts 10.

The material, arrangement, and the like of each member are as described for the light-emitting module 200, and their descriptions are omitted as appropriate.

Providing Light-Transmissive Member Joined Body

The step S101 of providing the light-transmissive member joined body provides the light-transmissive member joined body 35 that includes the plurality of submounts 10, the plurality of light-emitting elements 20 respectively disposed on the submounts 10, and the single light-transmissive member 31 disposed on the light-emitting elements 20.

The step S101 includes the step S101a of providing an undivided board, the step S101b of mounting the light-emitting elements, and the step S101c of disposing the light-transmissive member, and the step S101d of forming the submounts.

Providing Undivided Board

In the step S101a of providing the undivided board, the undivided board 11 is provided. The undivided board 11 includes the plurality of submount regions 12 each of which constitutes the submount 10 after the undivided board 11 is divided.

The undivided board 11 is a board that includes the submount regions 12 on which light-emitting elements 20 are respectively mounted. The undivided board 11 shown in FIG. 3A includes four submount regions 12, however, the number of the submount regions 12 can be appropriately determined.

In the step S101a of providing the undivided board, grooves 13 are preferably formed on portions of a surface of the undivided board 11 to be divided for each of the submount regions 12 while being on a surface on which the light-emitting elements 20 are mounted. With the grooves 13 in the undivided board 11, the undivided board 11 is easily divided. Each of the grooves 13 is preferably formed from the surface on which the light-emitting elements 20 are mounted toward the thickness direction of the undivided board 11, and has a depth of half or more of the thickness of the undivided board 11. With the groove 13 having the depth of half or more of the thickness of the undivided board 11, the undivided board 11 can be more easily divided. In view of securing the strength of the undivided board 11, the depth of the groove 13 is preferably ¾ or less of the thickness of the undivided board 11. The groove 13 preferably has a width broader than the cutting width to divide the undivided board 11. This configuration allows the undivided board 11 to be divided under a condition in which a start point for dividing the undivided board 11 is somewhat shifted from a desired position on a surface opposite to the surface on which the light-emitting elements 20 (i.e., an element mounting surface) are mounted.

The groove 13 can be formed by, for example, cutting with a blade and etching a predetermined position using a mask.

Mounting Light-Emitting Elements

In the step S101b of mounting the light-emitting elements, the light-emitting elements 20 are mounted in the plurality of submount regions 12.

In the step S101b, each of the plurality of light-emitting elements 20 is mounted on a respective one of the submount regions 12. The light-emitting element 20 has an electrode forming surface as a mounting surface and is flip-chip mounted on first wiring portions that are disposed in the submount region 12 via the electro conductive adhesives.

At this time, each of the plurality of protective elements 25 is mounted on a respective one of the submount regions 12.

Disposing Light-Transmissive Member

In the step S101c of disposing the light-transmissive member, a single light-transmissive member 31 is disposed on the plurality of light-emitting elements 20.

In the step S101c, for example, the single light-transmissive member 31 having a predetermined shape is joined to upper surfaces of the light-emitting elements 20 (in other words, main light extracting surfaces) that are opposite to the electrode forming surfaces. The single light-transmissive member 31 can has a plate-like shape, and be divided into the light-transmissive members 30 that constitute the element structures 15. That is, the single light-transmissive member 31 is an undivided body of the light-transmissive member 30. The single light-transmissive member 31 can be bonded to the light-emitting elements 20 directly or via light-transmissive bonding members.

Forming Submount

In the step S101d of forming submounts, the undivided board 11 is divided for each submount region 12 into the plurality of submounts 10.

In the step S101d, by dividing the undivided board 11 at the predetermined position, the undivided board 11 is singulated into the submounts 10. The undivided board 11 can be divided by cutting the undivided board 11 from a surface opposite to the element mounting surface to the grooves 13 using, for example, a blade. The forming of the grooves 13 can avoid the blade from reaching the light-transmissive member 31 during cutting.

Disposing Light-Transmissive Member Joined Body

In the step S102 of disposing the light-transmissive member joined body, the light-transmissive member joined body 35 is disposed such that the submounts 10 face the module board 80. That is, the light-transmissive member joined body 35 is disposed on the module board 80 such that lower surfaces of the submount 10 (that is, the surfaces opposite to the surfaces on which the light-emitting elements 20 are mounted) are in contact with the upper surface of the module board 80.

In the step S102, the light-transmissive member joined body 35 is disposed on the upper surface of the module board 80. The light-transmissive member joined body 35 has a surface closer to the submount 10 as a mounting surface, and is disposed on the upper surface of the module board 80 via the electroconductive adhesives 8.

Forming Element Structures

In the step S103 of forming the element structures, the single light-transmissive member 31 is divided for each light-emitting element 20 into the plurality of element structures 15 each of which includes the submount 10, the light-emitting element 20, and the light-transmissive member 30 positioned in this order.

In the step S103, by dividing the single light-transmissive member 31 at the predetermined position, the light-transmissive member joined body 35 is singulated into the element structures 15. The single light-transmissive member 31 can be divided using, for example, a blade.

Forming Frame

In the step S104 of forming the frame, the frame 50 that surrounds the plurality of element structures 15 is formed on the module board 80.

The frame 50 can be formed at a desired position on the module board 80 using, for example, a discharging device (i.e., a resin discharging device) that can continuously discharge a liquid resin by using air pressure (see Japanese Patent Publication No. 2009-182307).

The frame 50 can be formed at a desired position on the module board 80 using, for example, a frame-shaped member formed of molded resins, metals, alloys, or ceramics.

Forming First Covering Member

In the step S105 of forming the first covering member, the first covering member 40 is formed on the module board 80 to cover lateral surfaces of each element structure 15.

In the step S105, the first covering member 40 is formed inward of the frame 50 such that the first covering member 40 covers the lateral surfaces of each element structure 15.

In the step S105, an uncured resin material, which constitutes the first covering member 40, is supplied between the frame 50 and the element structures 15, and between the element structures 15 that are adjacent to each other, by, for example, potting or spraying. Thereafter, the resin material is cured to form the first covering member 40.

In the step S105, the first covering member 40 is formed such that the lateral surfaces of the element structures 15 (that is, the lateral surfaces of the submounts 10, the lateral surfaces of the light-emitting elements 20, and the lateral surfaces of the light-transmissive members 30) are covered, and upper surfaces of the light-transmissive members 30 are exposed. Alternatively, the first covering member 40 can be formed in such a manner that the first covering member 40 covers the upper surfaces of the light-transmissive members 30 and the lateral surfaces of the element structures 15, and then a portion of the first covering member 40 is removed by polishing, grinding, cutting, or the like, to expose the upper surfaces of the light-transmissive members 30.

In the method of manufacturing the light-emitting module 100 according to the first embodiment, the single light-transmissive member 31 is divided for each light-emitting element 20 after the light-transmissive member joined body 35 is disposed on the upper surface of the module board 80. With this configuration, if the single light-transmissive member 31 is divided using, for example, a blade, the distance between the divided light-transmissive members 30 can be the width of the blade. This can decrease the distance between the light-transmissive members 30. Also, the height of the light-emitting surface can be easily uniform compared with the case in which each of the light-transmissive members 30 is disposed on a respective one of the light-emitting elements 20.

Second Embodiment

Light-Emitting Module

Figure 4B:
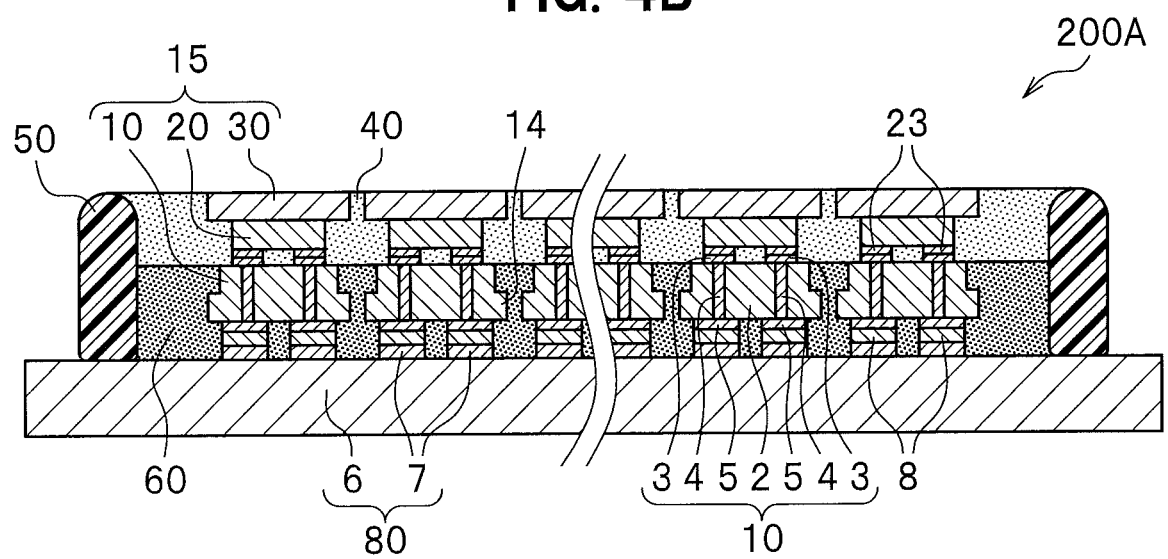
FIG. 4B is a schematic cross-sectional view taken along a line IVB-IVB of FIG. 4A.

FIG. 4A is a top view schematically illustrating the structure of a light-emitting module according to a second embodiment. FIG. 4B is a schematic cross-sectional view taken along a line IVB-IVB of FIG. 4A.

A light-emitting module 200A includes a module board 80, and on the module board 80, includes a plurality of element structures 15, a second covering member 60, and a first covering member 40.

The element structures 15 each include a submount 10, a light-emitting element 20, and a light-transmissive member 30 positioned in this order from the module board 80. Each of the element structures 15 is disposed on the module board 80 such that the submount 10 faces the module board 80.

The second covering member 60 covers the lateral surfaces of each submount 10, and holds the element structures 15.

The first covering member 40 covers the lateral surfaces of each light-emitting element 20 and the lateral surfaces of each light-transmissive member 30, and holds the element structures 15. The first covering member 40 has a light reflectance higher than a light reflectance of the second covering member 60 with respect to light emitted from the light-emitting elements 20.

In short, the light-emitting module 200A mainly includes the submounts 10, the light-emitting elements 20, the protective elements 25, the light-transmissive members 30, the second covering member 60, the first covering member 40, the frame 50, and the module board 80.

Regarding the configurations of the light-emitting module 200A, the matters different from the light-emitting module 200 will be described below.

The second covering member 60 is formed on the module board 80 to surround the submounts 10 of the plurality of element structures 15. The second covering member 60 is, for example, formed of a heat-dissipating resin containing a heat-dissipating material and, covers lateral surfaces of the submounts 10 on the module board 80. The second covering member 60 is formed inward of the frame 50 between the frame 50 and the submounts 10, as well as between the submounts 10 to the height up to the upper surfaces of the submounts 10.

Examples of resin materials for the second covering member 60 include the resin materials listed as examples for the light-transmissive member 30.

Examples of heat-dissipating materials include heat-dissipating silicone, aluminum oxide, aluminum nitride, boron nitride, silicon nitride, and magnesium oxide.

A material for the second covering member 60 is preferably appropriately selected to have a heat dissipation higher than a heat dissipation of the first covering member 40.

The first covering member 40 is formed on the upper surface of the second covering member 60. The first covering member 40 covers lateral surfaces of the light-emitting elements 20 and lateral surfaces of the light-transmissive members 30. The first covering member 40 is formed inward of the frame 50 between the frame 50 and the light-emitting elements 20, between the frame 50 and the light-transmissive members 30, between the light-emitting elements 20, and between the light-transmissive members 30.

A material for the first covering member 40 is appropriately selected to have a light reflectance higher than a light reflectance of the second covering member 60 with respect to light emitted from the light-emitting elements 20.

The second covering member 60 can cover at least a portion of the lateral surfaces of the submounts 10 (specifically, at least a portion of lateral surfaces of the base portions 2). The second covering members 60 can cover a portion of the lateral surfaces of the light-emitting elements 20. The first covering member 40 can cover a portion of the lateral surfaces of the submounts 10. An interface between the first covering member 40 and the second covering member 60 is preferably located above half of the height of the submounts 10 in view of heat dissipation, and is preferably below the light-emitting elements 20 in view of light reflectance.

Method of Manufacturing Light-Emitting Module

Figure 5:
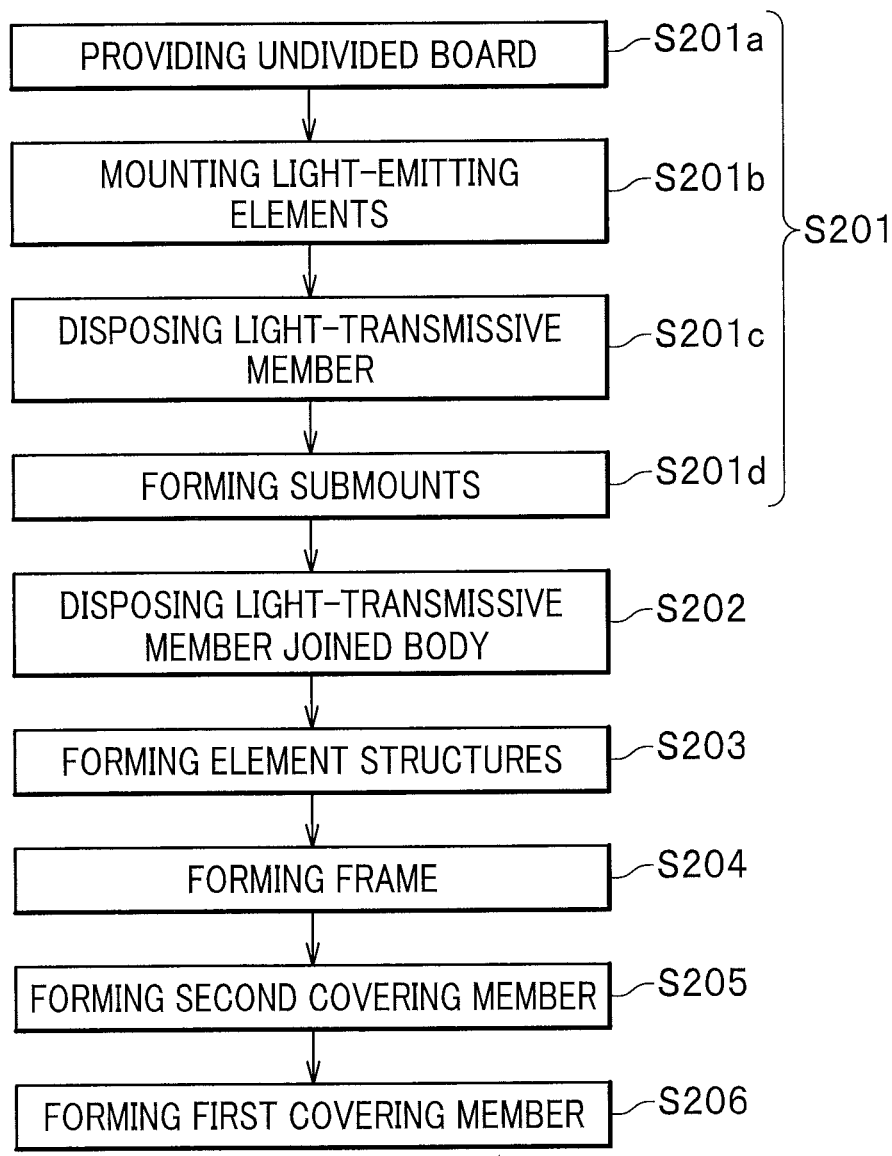
FIG. 5 is a flowchart of a method of manufacturing the light-emitting module according to the second embodiment.
Figure 6A:
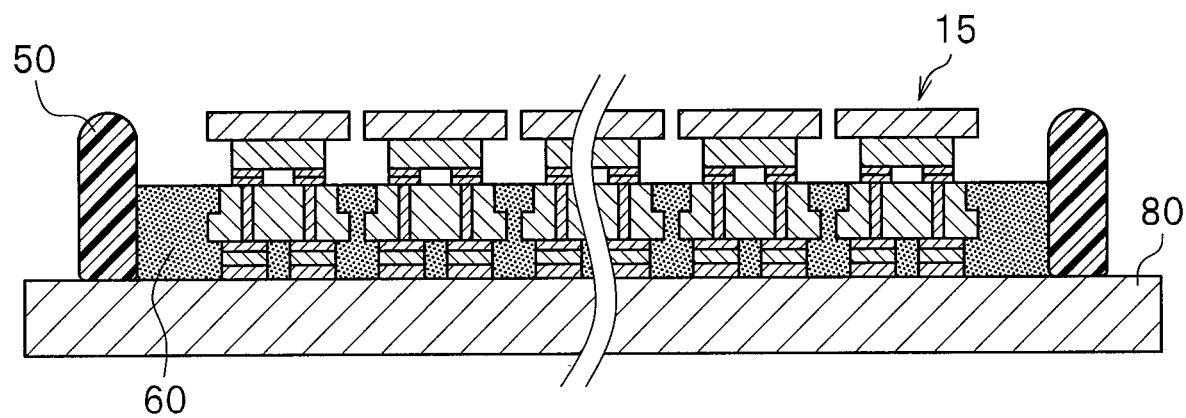
FIG. 6A is a schematic cross-sectional view illustrating a step of forming a second covering member in the method of manufacturing the light-emitting module according to the second embodiment.
Figure 6B:
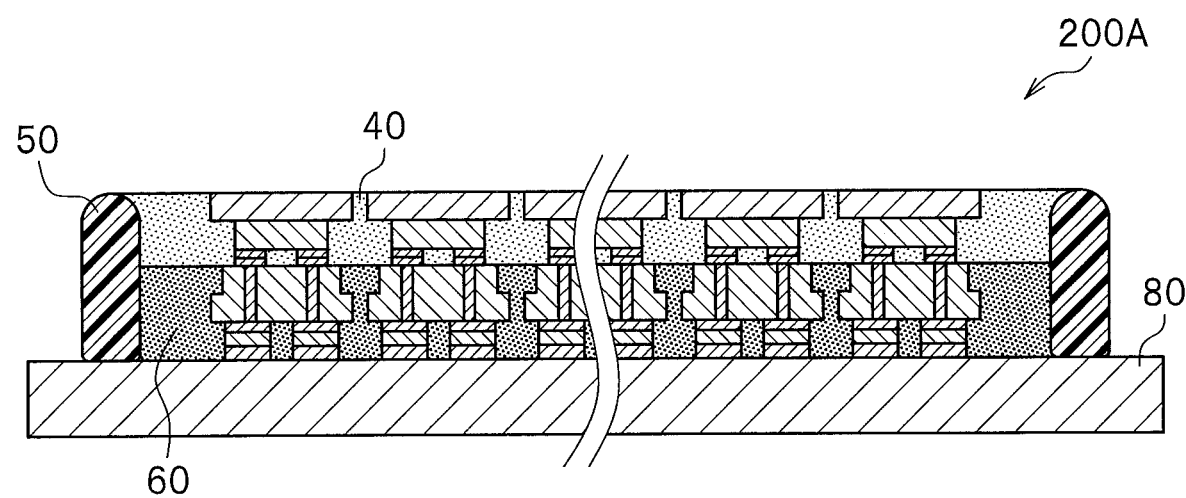
FIG. 6B is a schematic cross-sectional view illustrating a step of forming a first covering member in the method of manufacturing the light-emitting module according to the second embodiment.
Figure 6C:
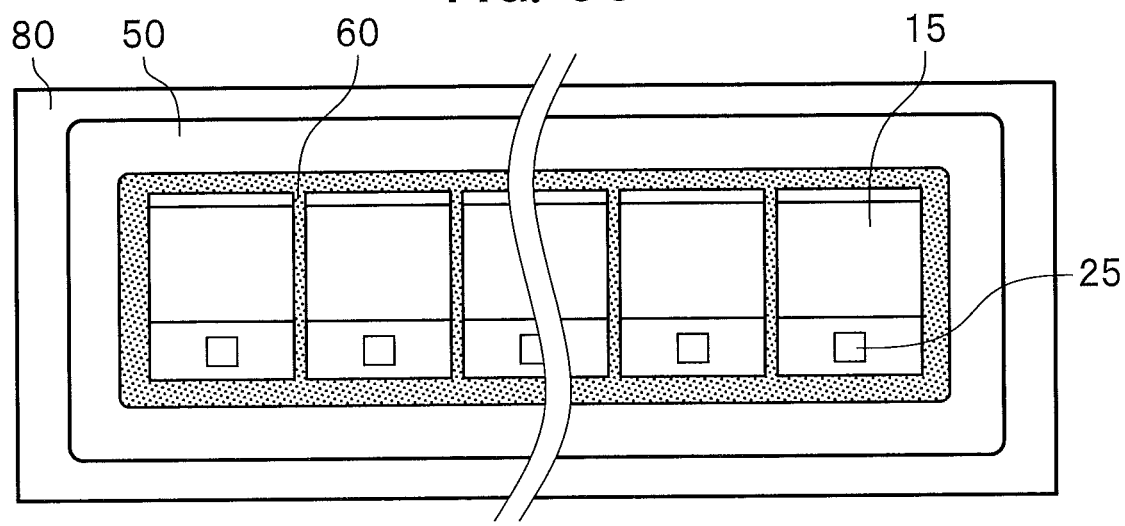
FIG. 6C is a schematic top view illustrating the step of forming the second covering member in the method of manufacturing the light-emitting module according to the second embodiment.
Figure 6D:
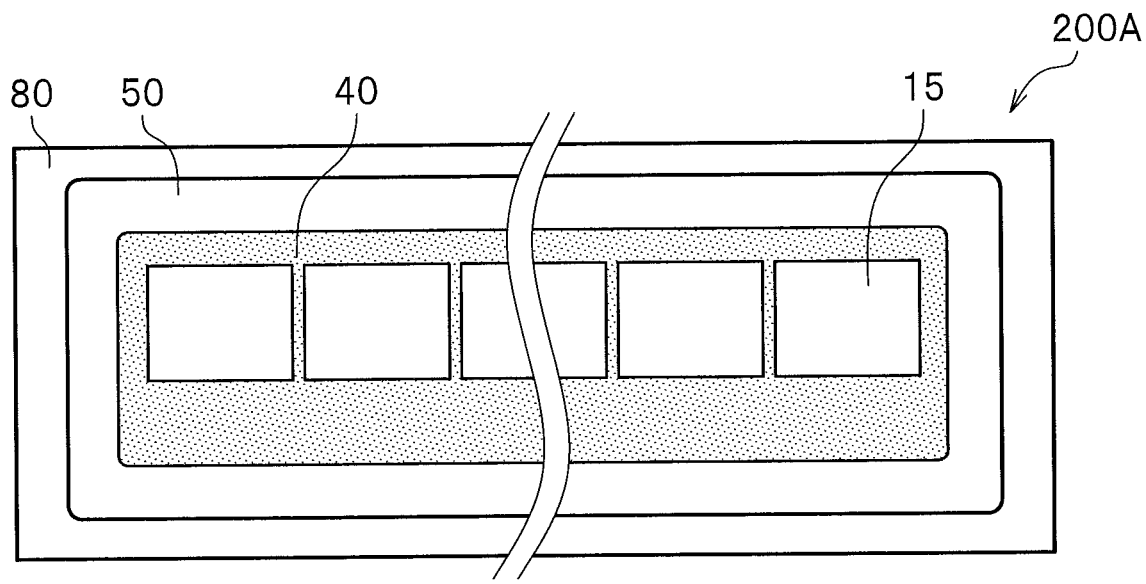
FIG. 6D is a schematic top view illustrating the step of forming the first covering member in the method of manufacturing the light-emitting module according to the second embodiment.

FIG. 5 is a flowchart of a method of manufacturing the light-emitting module according to the second embodiment. FIG. 6A is a schematic cross-sectional view illustrating a step of forming a second covering member in the method of manufacturing the light-emitting module according to the second embodiment. FIG. 6B is a schematic cross-sectional view illustrating a step of forming a first covering member in the method of manufacturing the light-emitting module according to the second embodiment. FIG. 6C is a schematic top view illustrating the step of forming the second covering member in the method of manufacturing the light-emitting module according to the second embodiment. FIG. 6D is a schematic top view illustrating the step of forming the first covering member in the method of manufacturing the light-emitting module according to the second embodiment.

A method of manufacturing a light-emitting module 200A includes: a step S201 of providing a light-transmissive member joined body that includes a plurality of submounts 10, a plurality of light-emitting elements 20 each of which is disposed on a respective one of submounts 10, and a single light-transmissive member 31 disposed on the light-emitting elements 20; a step S202 of disposing the light-transmissive member joined body 35 on a module board 80 such that the submounts 10 face the module board 80; a step S203 of forming a plurality of element structures by dividing the single light-transmissive member 31 for each light-emitting element 20 into the element structures 15 each of which includes the submount 10, the light-emitting element 20, and the light-transmissive member 30 positioned in this order; a step S204 of forming a frame 50 on the module board 80 to surround the element structures 15; a step S205 of forming a second covering member 60 on the module board 80 to cover the lateral surfaces of each submount 10; and a step S206 of forming a first covering member 40 on the second covering member 60 to cover the lateral surfaces of each light-emitting element 20 and the lateral surfaces of each light-transmissive member 30. The first covering member 40 has a light reflectance higher than a light reflectance of the second covering member 60 with respect to light emitted from the light-emitting elements 20.

The step S201 of providing the light-transmissive member joined body includes a step S201a of providing an undivided board 11 including a plurality of submount regions 12 each of which constitutes the submount 10 after the undivided board 11 is divided, a step S201b of mounting the light-emitting elements 20 in the submount regions 12, a step S201c of disposing a single light-transmissive member 31 on the light-emitting elements 20, and a step S201d of forming the submounts by dividing the undivided board 11 for each submount region 12 into the submounts 10.

The material, arrangement, and the like of each member are as described for the light-emitting module 200A, and their descriptions are omitted as appropriate.

Providing Light-Transmissive Member Joined Body

The step S201 of providing the light-transmissive member joined body is substantially the same as the above-described step S101 of providing the light-transmissive member joined body.

Disposing Light-Transmissive Member Joined Body

The step S202 of disposing the light-transmissive member joined body is substantially the same as the above-described step S102 of disposing the light-transmissive member joined body.

Forming Element Structures

The step S203 of forming the element structures is substantially the same as the above-described step S103 of forming the element structures.

Forming Frame

The step S204 of forming the frame is substantially the same as the above-described step S104 of forming the frame.

Forming Second Covering Member

In the step S205 of forming the second covering member, the second covering member 60 is formed on the module board 80 to cover lateral surfaces of each submount 10.

In the step S205, the second covering member 60 is formed inward of the frame 50 such that the second covering member 60 covers the lateral surfaces of the submounts 10.

In the step S205, an uncured resin material that contains a heat-dissipating material is supplied between the frame 50 and the submounts 10, and between the lateral surfaces of the submounts 10 that are adjacent to and facing each other, by, for example, potting or spraying. Thereafter, the resin material is cured to form the second covering member 60.

In the step S205, the second covering member 60 is formed to cover the lateral surfaces of the submounts 10 to the height up to the upper surfaces of the submounts 10, specifically to the height up to the lateral surfaces of the base portions 2.

Forming First Covering Member

In the step S206 of forming the first covering member, the first covering member 40 is formed on the second covering member 60 to cover the lateral surfaces of each light-emitting element 20 and the lateral surfaces of each light-transmissive member 30. In the step S206, for the first covering member 40, a member is used that has a light reflectance higher than a light reflectance of the second covering member 60 with respect to light emitted from the light-emitting elements 20.

In the step S206, the first covering member 40 is formed inward of the frame 50 such that the first covering member 40 covers lateral surfaces of the light-emitting elements 20 and lateral surfaces of the light-transmissive members 30.

In the step S206, an uncured resin material that contains a reflective material is positioned between the frame 50 and the light-emitting elements 20, between the frame 50 and the light-transmissive members 30, between the light-emitting elements 20 that are adjacent to each other, and between the light-transmissive members 30 that are adjacent to each other, by, for example, potting or spraying. Thereafter, the resin material is cured to form the first covering member 40.

In the step S206, the first covering member 40 is formed such that the lateral surfaces of the light-emitting elements 20 and the lateral surfaces of the light-transmissive members 30 are covered, and upper surfaces of the light-transmissive members 30 are exposed. Alternatively, the first covering member 40 can be formed in such a manner that the first covering member 40 covers the upper surfaces and lateral surfaces of the light-transmissive members 30 and lateral surfaces of the light-emitting elements 20, and then a portion of the first covering member 40 is removed by polishing, grinding, cutting, or the like, to expose the upper surfaces of the light-transmissive members 30.

Third Embodiment

Light-Emitting Module

Figure 7B:
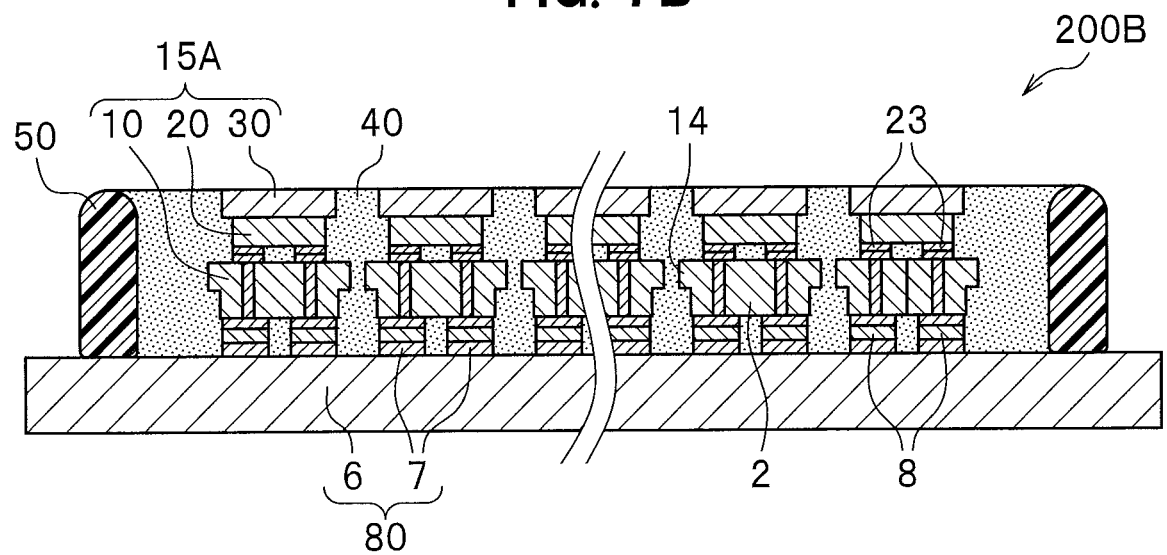
FIG. 7B is a schematic cross-sectional view taken along a line VIIB-VIIB of FIG. 7A.

FIG. 7A is a top view schematically illustrating the structure of a light-emitting module according to a third embodiment. FIG. 7B is a schematic cross-sectional view taken along a line VIIB-VIIB of FIG. 7A.

A light-emitting module 200B includes element structures 15A instead of the element structures 15. In the element structures 15A, each of the light-transmissive members 30 has a length in a longitudinal direction of the light-emitting module 200B that is smaller than the length of the submount 10 in a longitudinal direction of the light-emitting module 200B in a top view.

In the light-emitting module 200B, a module board joined body 85 is provided in the method of manufacturing the light-emitting module 200B described below, and thereafter the undivided board 11 is divided from the light-transmissive member 30 side. Accordingly, the width of the light-transmissive member 30 needs to be set such that the undivided board 11 can be easily divided.

Figure 9A:
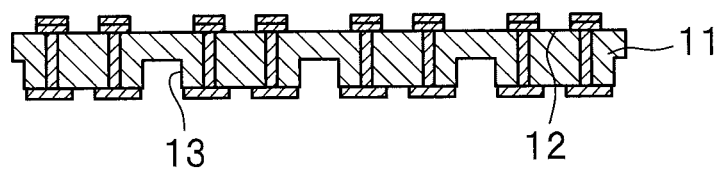
FIG. 9A is a schematic cross-sectional view illustrating a step of providing an undivided board in the method of manufacturing the light-emitting module according to the third embodiment.

In the method of manufacturing the light-emitting module 200B described below, the base portion 2 includes at least an extending portion 14 on lateral surfaces in a longitudinal direction of the light-emitting module 200B by forming grooves 13 on surfaces of an undivided board 11 opposite to a surface on which the light-emitting elements 20 are mounted (see FIG. 9A). The extending portions 14 extend outwardly from portions of one or more of the lateral surfaces close to the light-emitting element 20.

Other matters are substantially the same as the light-emitting module 200 of the first embodiment.

Method of Manufacturing Light-Emitting Module

Figure 8:
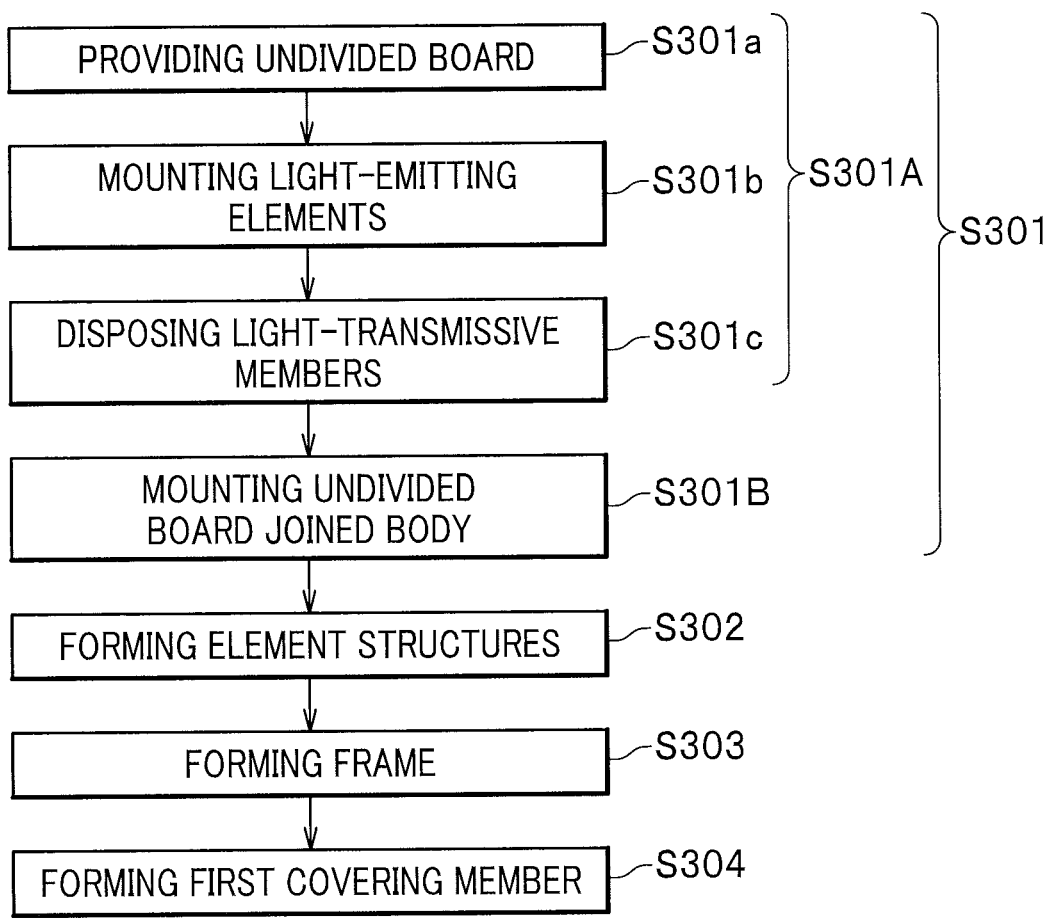
FIG. 8 is a flowchart of a method of manufacturing the light-emitting module according to the third embodiment.
Figure 9B:
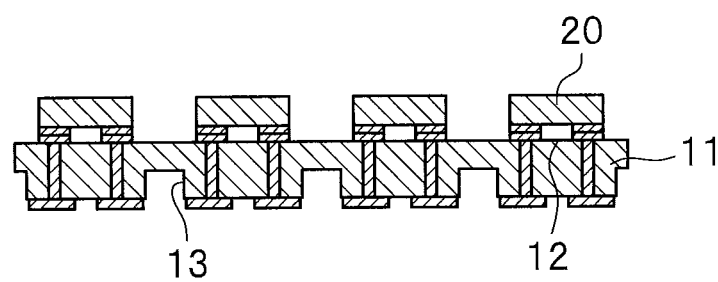
FIG. 9B is a schematic cross-sectional view illustrating a step of mounting light-emitting elements in the method of manufacturing the light-emitting module according to the third embodiment.
Figure 9C:
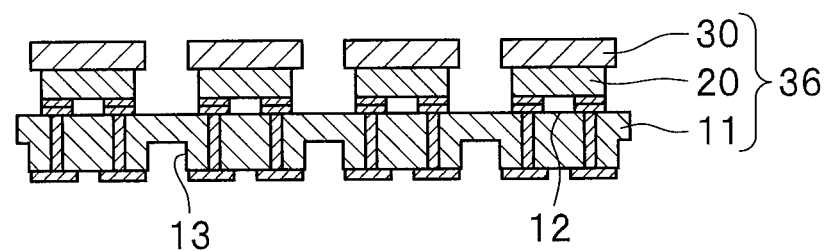
FIG. 9C is a schematic cross-sectional view illustrating a step of disposing light-transmissive members in the method of manufacturing the light-emitting module according to the third embodiment.
Figure 9D:
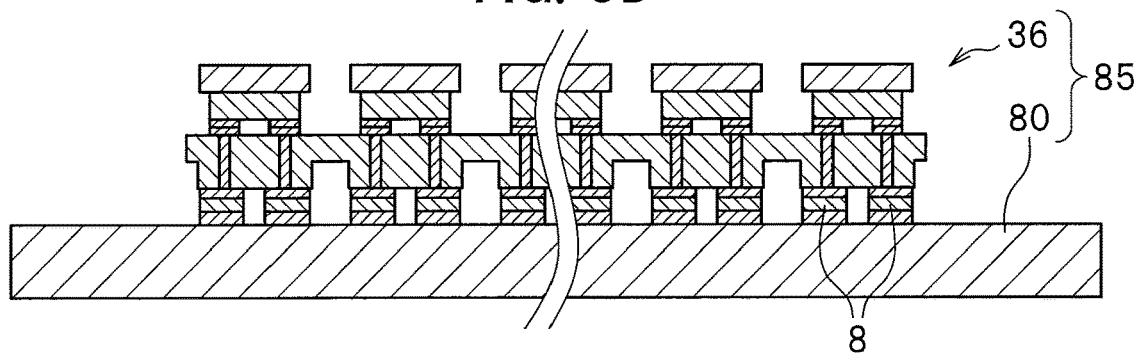
FIG. 9D is a schematic cross-sectional view illustrating a step of mounting an undivided board joined body in the method of manufacturing the light-emitting module according to the third embodiment.
Figure 9E:
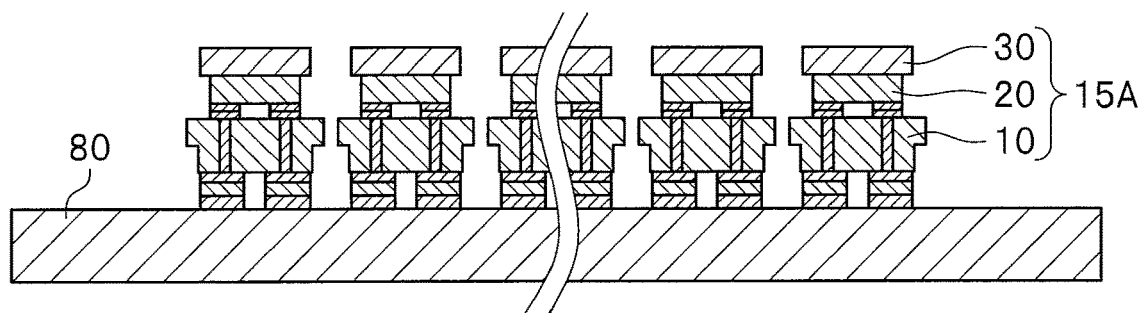
FIG. 9E is a schematic cross-sectional view illustrating a step of forming an element structure in the method of manufacturing the light-emitting module according to the third embodiment.
Figure 9F:
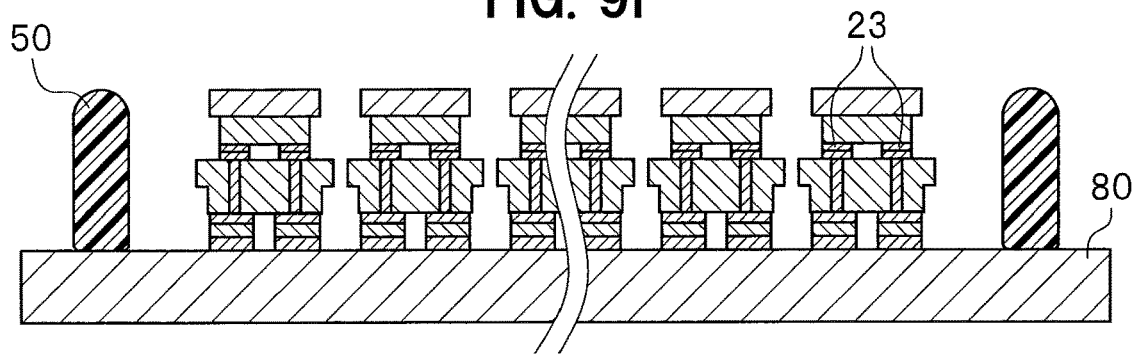
FIG. 9F is a schematic cross-sectional view illustrating a step of forming a frame in the method of manufacturing the light-emitting module according to the third embodiment.
Figure 9G:
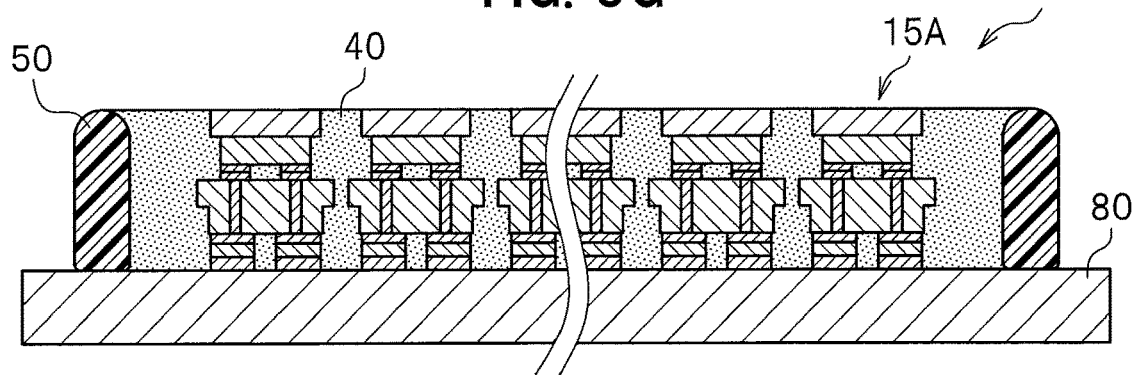
FIG. 9G is a schematic cross-sectional view illustrating a step of forming a first covering member in the method of manufacturing the light-emitting module according to the third embodiment.

FIG. 8 is a flowchart of a method of manufacturing the light-emitting module according to the third embodiment. FIG. 9A is a schematic cross-sectional view illustrating a step of providing an undivided board in the method of manufacturing the light-emitting module according to the third embodiment. FIG. 9B is a schematic cross-sectional view illustrating a step of mounting light-emitting elements in the method of manufacturing the light-emitting module according to the third embodiment. FIG. 9C is a schematic cross-sectional view illustrating a step of disposing light-transmissive members in the method of manufacturing the light-emitting module according to the third embodiment. FIG. 9D is a schematic cross-sectional view illustrating a step of mounting an undivided board joined body in the method of manufacturing the light-emitting module according to the third embodiment. FIG. 9E is a schematic cross-sectional view illustrating a step of forming an element structure in the method of manufacturing the light-emitting module according to the third embodiment. FIG. 9F is a schematic cross-sectional view illustrating a step of forming a frame in the method of manufacturing the light-emitting module according to the third embodiment. FIG. 9G is a schematic cross-sectional view illustrating a step of forming a first covering member in the method of manufacturing the light-emitting module according to the third embodiment.

A method of manufacturing the light-emitting module 200B includes: a step S301 of providing a module board joined body 85 including a module board 80 and an undivided board joined body 36 that includes an undivided board 11 including a plurality of submount regions 12 each of which constitutes a submount 10 after the undivided board 11 is divided, light-emitting elements 20 each of which is disposed in a respective one of the submount regions 12, and light-transmissive members 30 each of which is disposed on a respective one of the light-emitting elements 20, the undivided board joined body 36 being disposed such that the undivided board 11 faces the module board 80; a step S302 of forming a plurality of element structures by dividing the undivided board 11 for each submount region 12 into the element structures 15A each of which includes the submount 10, the light-emitting element 20, and the light-transmissive member 30 positioned in this order; a step S303 of forming a frame 50 on the module board 80 to surround the element structures 15A; and a step S304 of forming a first covering member 40 on the module board 80 to cover lateral surfaces of each element structure 15.

The step S301 of providing the module board joined body includes a step S301A of providing the undivided board joined body 36 and a step S301B of mounting the undivided board joined body 36 on the module board 80.

The step S301A of providing the undivided board joined body includes a step S301a of providing the undivided board 11, a step S301b of mounting the light-emitting elements 20 each of which is mounted in a respective one of the submount regions 12, and a step S301c of disposing the light-transmissive members 30 each of which is disposed on a respective one of the light-emitting elements 20.
Providing Module Board Joined Body In the step S301 of providing the module board joined body, the module board joined body 85 is provided. In the module board joined body 85, the undivided board joined body 36 that includes the undivided board 11 having the plurality of submount regions 12, the light-emitting elements 20 each of which is disposed in a respective one of the submount regions 12, and the light-transmissive members 30 each of which is disposed on a respective one of the light-emitting elements 20 is mounted such that the undivided board 11 faces the module board 80. The submount regions 12 constitute the submounts 10 after the undivided board 11 is divided.

The step S301 includes a step S301A of providing the undivided board joined body and a step S301B of mounting the undivided board joined body.
Providing Undivided Board Joined Body In the step S301A of providing the undivided board joined body, the undivided board joined body 36 is provided.

The step S301A includes the step S301a of providing the undivided board, the step S301b of mounting the light-emitting elements, and the step S301c of disposing the light-transmissive members.
Providing Undivided Board In the step S301a of providing the undivided board, the undivided board 11 that includes the plurality of submount regions 12 is provided. The submount regions 12 each of which constitutes the submount 10 after the undivided board 11 is divided.

In the step S301a of providing the undivided board, grooves 13 are preferably formed on a portion of a surface of the undivided board 11 to be divided for each of the submount regions 12 while being opposite to a surface on which the light-emitting elements 20 are mounted. The depth, forming method, and the like of the grooves 13, and other matters in the step S301a of providing the undivided board are substantially the same as the above-described step S101a of providing the undivided board.
Mounting Light-Emitting Elements The step S301b of mounting the light-emitting elements is substantially the same as the above-described step S101b of mounting the light-emitting elements.
Disposing Light-Transmissive Member In the step S301c of disposing the light-transmissive members, the light-transmissive members 30 each of which is disposed on a respective one of the light-emitting elements 20.

In the step S301c, for example, each of the light-transmissive members 30 having a predetermined shape is joined to an upper surface of a respective one of the light-emitting elements 20 (i.e., a main light extracting surface) that is opposite to the electrode forming surface. The light-transmissive member 30 can be bonded to the light-emitting element 20 directly or via light-transmissive bonding members.
Mounting Undivided Board Joined Body In the step S301B of mounting the undivided board joined body, the undivided board joined body 36 is disposed on the module board 80. That is, the undivided board joined body 36 is disposed on the module board 80 such that a lower surface of the undivided board 11 (i.e., the surface opposite to the surface on which the light-emitting elements 20 are mounted) is in contact with the upper surface of the module board 80.

In the step S301B, the undivided board joined body 36 is disposed on the upper surface of the module board 80. The undivided board joined body 36 has a surface closer to the undivided board 11 as a mounting surface, and is disposed on the upper surface of the module board 80 via the electroconductive adhesives 8.
Forming Element Structures In the step S302 of forming the element structures, the undivided board 11 is divided for each submount region 12 into a plurality of element structures 15A each of which includes the submount 10, the light-emitting element 20, and the light-transmissive member 30 positioned in this order.

In the step S302, the singulated element structures 15A are obtained by dividing the undivided board 11 at the predetermined position.

The undivided board 11 can be divided by cutting from the surface on which the light-emitting elements 20 and the light-transmissive members 30 are disposed, up to the grooves 13 using, for example, a blade. The forming of the grooves 13 on the opposite surface to the surface on which the light-emitting elements 20 are mounted can avoid the blade from reaching the module board 80 during cutting.
Forming Frame The step S303 of forming the frame is substantially the same as the above-described step S104 of forming the frame.
Forming First Covering Member The step S304 of forming the first covering member is substantially the same as the above-described step S105 of forming the first covering member.

Fourth Embodiment

Light-Emitting Module

Figure 10A:
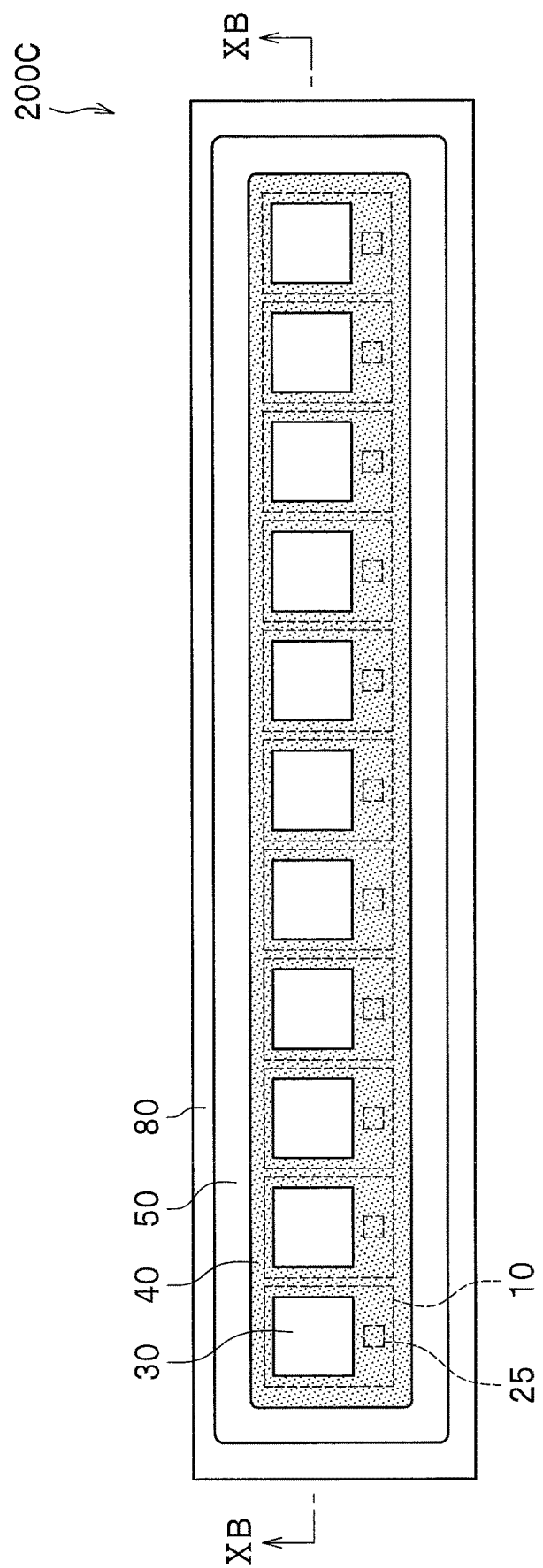
FIG. 10A is a top view schematically illustrating the structure of a light-emitting module according to a fourth embodiment.
Figure 10B:
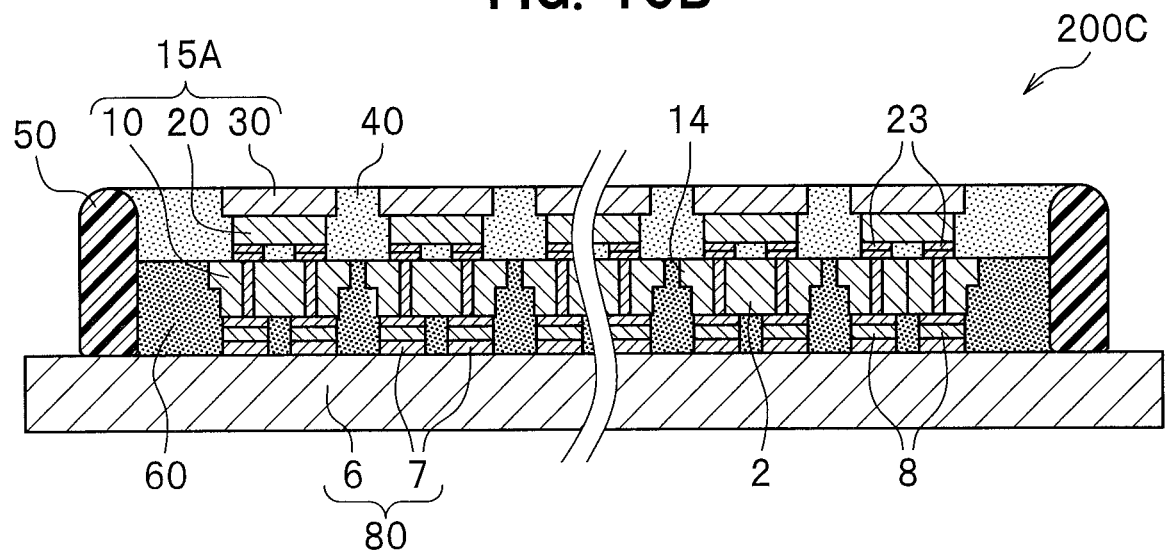
FIG. 10B is a schematic cross-sectional view taken along a line XB-XB of FIG. 10A.

FIG. 10A is a top view schematically illustrating the structure of a light-emitting module according to a fourth embodiment. FIG. 10B is a schematic cross-sectional view taken along a line XB-XB of FIG. 10A.

A light-emitting module 200C includes the element structures 15A instead of the element structures 15. In the element structures 15A, each of the light-transmissive members 30 has a length in a longitudinal direction of the light-emitting module 200C that is smaller than the length of the submount 10 in a longitudinal direction of the light-emitting module 200C in a top view.

Other matters are substantially the same as the light-emitting module 200A of the second embodiment.

Method of Manufacturing Light-Emitting Module

Figure 11:
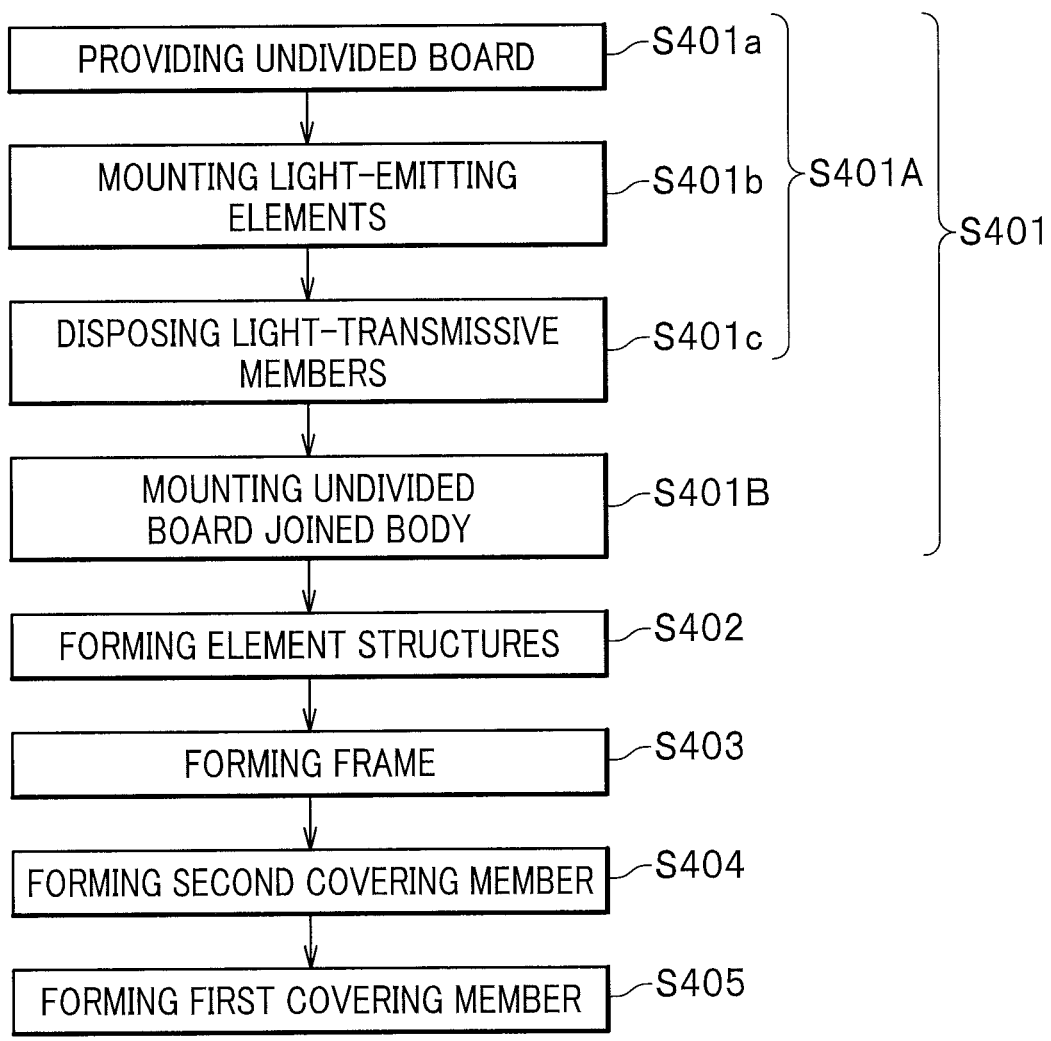
FIG. 11 is a flowchart of a method of manufacturing the light-emitting module according to the fourth embodiment.

FIG. 11 is a flowchart of a method of manufacturing the light-emitting module according to the fourth embodiment.

A method of manufacturing the light-emitting module 200C includes: a step S401 of providing a module board joined body 85 including a module board 80 and an undivided board joined body 36 that includes an undivided board 11 including a plurality of submount regions 12 each of which constitutes a submount 10 after the undivided board 11 is divided, light-emitting elements 20 each of which is disposed in a respective one of the submount regions 12, and light-transmissive members 30 each of which is disposed on a respective one of the light-emitting elements 20, the undivided board joined body 36 being disposed such that the undivided board 11 faces the module board 80; a step S402 of forming a plurality of element structures by dividing the undivided board 11 for each submount region 12 into the element structures 15A each of which includes the submount 10, the light-emitting element 20, and the light-transmissive member 30 positioned in this order; a step S403 of forming a frame 50 on the module board 80 to surround the element structures 15A; a step S404 of forming a second covering member 60 on the module board 80 to cover the lateral surfaces of each submount 10; and a step S405 of forming a first covering member 40 on the second covering member 60 to cover lateral surfaces of each light-emitting element 20 and lateral surfaces of each light-transmissive member 30. The first covering member 40 has a light reflectance higher than a light reflectance of the second covering member 60 with respect to light emitted from the light-emitting elements 20.

The step S401 of providing the module board joined body includes a step S401A of providing the undivided board joined body 36 and a step S401B of mounting the undivided board joined body 36 on the module board 80.

The step S401A of providing the undivided board joined body includes a step S401a of providing the undivided board 11, a step S401b of mounting the light-emitting elements 20 each of which is mounted in a respective one of the submount regions 12, and a step S401c of disposing the light-transmissive members 30 each of which is disposed on a respective one of the light-emitting elements 20.

The step S401 of providing the module board joined body, the step S402 of forming the element structures, and the step S403 of forming the frame are respectively substantially the same as the step S301 of providing the module board joined body, the step S302 of forming the element structures, and the step S303 of forming the frame described above. The step S404 of forming the second covering member and the step S405 of forming the first covering member are respectively substantially the same as the step S205 of forming the second covering member and the step S206 of forming the first covering member described above.

That is, the method of manufacturing the light-emitting module 200C is substantially the same as the method of manufacturing the light-emitting module 200A except that the undivided board joined body 36 is disposed on the upper surface of the module board 80 before the undivided board 11 is divided for each submount region 12 to constitute the plurality of element structures 15A, and except for the position of the grooves 13 on the undivided board 11.

OTHER EMBODIMENTS

Figure 12:
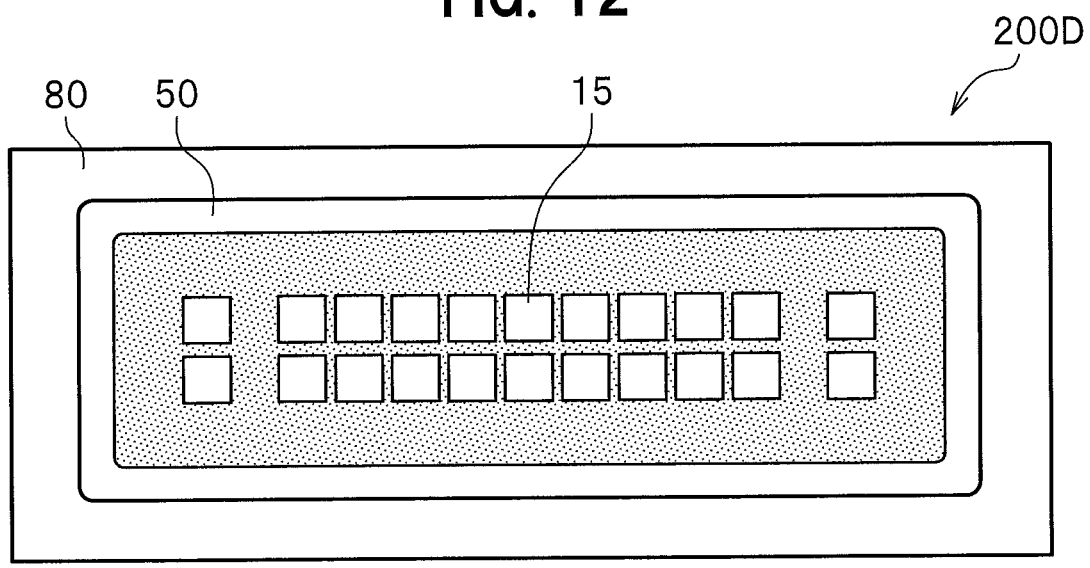
FIG. 12 is a top view schematically illustrating the structure of a light-emitting module according to another embodiment.

FIG. 12 is a top view schematically illustrating the structure of a light-emitting module according to another embodiment.

A light-emitting module 200D includes a plurality of element structures 15 disposed in a matrix shape of two rows and eleven columns. In this example, the element structures 15 located at both ends of each row are respectively disposed so as to have a greater distance to the adjacent one of the element structures 15 than a distance between the adjacent ones of the other element structures 15 in the row direction.

The number of rows and columns to dispose the light-emitting module are not limited. Also, the number of the element structures 15 in each row and each column can be appropriately selected according to the desired light-distribution pattern. In the light-emitting module, the combination of element structures 15 having a different size of the light-emitting surface and the layout of the element structures 15 can be appropriately adjusted according to the desired light-distribution pattern.

The above-described light-emitting module can include or not include a frame. In the case in which the light-emitting module includes a frame, the frame can be disposed continuously or intermittently near an outer periphery of the light-emitting module. The height of the frame can be lower than the height of the element structure. The submount and the module board can have a substantially square shape in a top view. The frame can have a substantially square shape in a top view. The submount, the module board, and the frame can have other shapes.

The method of manufacturing the light-emitting module another step between the steps or before or after the steps, as long as the additional step does not adversely affect the other steps. For example, a foreign matter removal step of removing foreign matters mixed during manufacture can be included.

In the method of manufacturing the light-emitting modules 200B and 200C, the undivided board joined body 36 is disposed on the module board 80 in the step of providing the module board joined body. However, the sequence can be such that the undivided board 11 is disposed on the module board 80, thereafter the light-emitting elements 20 each of which is disposed in a respective one of submount regions 12, and the light-transmissive members 30 each of which is disposed on a respective one of the light-emitting elements 20. Also, the grooves 13 can be formed or may not be formed in the undivided board 11 in the method of manufacturing the light-emitting module.

In the method of manufacturing the light-emitting module, the order of some steps is not limited but can be changed. For example, in the above-described method of manufacturing the light-emitting module, the step of forming the frame is performed after the step of forming the element structures and before the step of forming the first covering member, or after the step of forming the element structures and before the step of forming the second covering member. However, the step of forming the frame can be performed at any time before the step of forming the first covering member or before the step of forming the second covering member.

The light-emitting module according to the embodiments of the present disclosure can be used for a light source of an Adaptive Driving Beam (ADB) type headlight. Other applications of the light-emitting module according to the embodiments of the present disclosure include light sources for backlights of liquid-crystal displays, a variety of lighting apparatuses, large format displays, and various displays for advertisements or destination guides, as well as digital video cameras, image scanners in apparatuses such as facsimile machines, copying machines, and scanners, projectors, and other apparatuses.

The invention claimed is:

1. A method of manufacturing a light-emitting module, the method comprising:
   providing a light-transmissive member joined body that includes
      a plurality of submounts,
      a plurality of light-emitting elements each of which is disposed on a respective one of the submounts, and
      a single light-transmissive member disposed on the light-emitting elements;
   disposing the light-transmissive member joined body on a module board such that the submounts face the module board;
   forming a plurality of element structures by dividing the single light-transmissive member for each light-emitting element into the element structures each of which includes the submount, the light-emitting element, and the light-transmissive member positioned in this order; and
   forming a first covering member on the module board to cover lateral surfaces of the element structures.

2. The method of manufacturing a light-emitting module according to claim 1, further comprising, before the forming of the first covering member on the module board, forming a frame on the module board to surround the plurality of element structures,
   wherein the first covering member is disposed inward of the frame such that the first covering member covers the lateral surfaces of the element structures.

3. The method of manufacturing a light-emitting module according to claim 1, wherein the providing of the light-transmissive member joined body comprises:
   providing an undivided board that includes a plurality of submount regions each of which constitutes a submount after the undivided board is divided;
   mounting the light-emitting elements each of which is disposed on a respective one of the submount regions;
   disposing the single light-transmissive member on the light-emitting elements; and
   dividing the undivided board for each of the submount regions into the plurality of submounts.

4. The method of manufacturing a light-emitting module according to claim 3, wherein, in the providing of the undivided board, grooves are formed on portions of a surface of the undivided board to be divided for each of the submount regions while being on a surface on which the light-emitting elements are mounted.

5. The method of manufacturing a light-emitting module according to claim 1, wherein the first covering member is a light-reflective resin.

6. A method of manufacturing a light-emitting module, the method comprising:
   providing a light-transmissive member joined body that includes
      a plurality of submounts,
      a plurality of light-emitting elements each of which is disposed on a respective one of submounts, and
      a single light-transmissive member disposed on the light-emitting elements;
   disposing the light-transmissive member joined body on a module board such that the submounts face the module board;
   forming a plurality of element structures by dividing the single light-transmissive member for each light-emitting element into the element structures each of which includes the submount, the light-emitting element, and the light-transmissive member positioned in this order;
   forming a second covering member on the module board to cover lateral surfaces of the submounts; and
      forming a first covering member on the second covering member to cover lateral surfaces of the light-emitting elements and lateral surfaces of the light-transmissive members, the first covering member having a light reflectance higher than a light reflectance of the second covering member with respect to light emitted from the light-emitting elements.

7. The method of manufacturing a light-emitting module according to claim 6, wherein the second covering member has a heat dissipation higher than a heat dissipation of the first covering member.

8. The method of manufacturing a light-emitting module according to claim 6, further comprising, before the forming of the second covering member on the module board, forming a frame on the module board to surround the plurality of element structures,
   wherein the second covering member and the first covering member are disposed inward of the frame such that the second covering member covers lateral surfaces of the submounts and the first covering member covers lateral surfaces of the light-emitting elements and lateral surfaces of the light-transmissive members.

9. A method of manufacturing a light-emitting module, the method comprising:
   providing a module board joined body including a module board and an undivided board joined body that includes
      an undivided board including a plurality of submount regions each of which constitutes a submount after the undivided board is divided,
      a plurality of light-emitting elements each of which is disposed in a respective one of the submount regions, and
      a plurality of light-transmissive members each of which is disposed on a respective one of the light-emitting elements, the undivided board joined body being disposed such that the undivided board faces the module board;
   forming a plurality of element structures by dividing the undivided board for each submount region into the element structures each of which includes the submount, the light-emitting element, and the light-transmissive member positioned in this order; and
   forming a first covering member on the module board to cover lateral surfaces of the element structures.

10. The method of manufacturing a light-emitting module according to claim 9, further comprising, before the forming of the first covering member on the module board, forming a frame on the module board to surround the plurality of element structures,
- wherein the first covering member is disposed inward of the frame such that the first covering member covers lateral surfaces of the element structures.

11. The method of manufacturing a light-emitting module according to claim 9, wherein the providing of the module board joined body comprises:
- providing the undivided board joined body; and
- mounting the undivided board joined body on the module boards.

12. The method of manufacturing a light-emitting module according to claim 11, wherein the providing of the undivided board joined body comprises:
- providing the undivided board;
- mounting the light-emitting elements each of which is disposed on a respective one of the submount regions; and
- disposing the light-transmissive members on a respective one of the light-emitting elements.

13. The method of manufacturing a light-emitting module according to claim 9, wherein, in the providing of the module board joined body, grooves are formed on portions of a surface of the undivided board to be divided for each of the submount regions while being opposite to a surface on which the light-emitting elements are mounted.

14. A method of manufacturing a light-emitting module, the method comprising:
- providing a module board joined body including a module board and an undivided board joined body that includes
  - an undivided board including a plurality of submount regions each of which constitutes a submount after the undivided board is divided,
  - a plurality of light-emitting elements each of which is disposed in a respective one of the submount regions, and
  - a plurality of light-transmissive members each of which is disposed on a respective one of the light-emitting elements, the undivided board joined body being disposed such that the undivided board faces the module board;
- forming a plurality of element structures by dividing the undivided board for each of the submount regions into the element structures each of which includes the submount, the light-emitting element, and the light-transmissive member positioned in this order;
- forming a second covering member on the module board to cover lateral surfaces of the submounts; and
- forming a first covering member on the second covering member to cover lateral surfaces of the light-emitting elements and lateral surfaces of the light-transmissive members, the first covering member having a light reflectance higher than a light reflectance of the second covering member with respect to light emitted from the light-emitting elements.

15. The method of manufacturing a light-emitting module according to claim 14, wherein the second covering member has a heat dissipation higher than a heat dissipation of the first covering member.

16. The method of manufacturing a light-emitting module according to claim 14, further comprising, before the forming of the second covering member on the module board, forming a frame on the module board to surround the plurality of element structures,
- wherein the second covering member and the first covering member are disposed in the frame such that second covering member covers lateral surfaces of the submounts and the first covering member covers lateral surfaces of the light-emitting elements and lateral surfaces of the light-transmissive members.

* * * * *